US009445526B2

(12) United States Patent
Zhou et al.

(10) Patent No.: US 9,445,526 B2
(45) Date of Patent: Sep. 13, 2016

(54) MODULAR JET IMPINGEMENT ASSEMBLIES WITH PASSIVE AND ACTIVE FLOW CONTROL FOR ELECTRONICS COOLING

(71) Applicant: Toyota Motor Engineering & Manufacturing North America, Inc., Erlanger, KY (US)

(72) Inventors: Feng Zhou, Ann Arbor, MI (US); Ercan Mehmet Dede, Ann Arbor, MI (US); Shailesh Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 81 days.

(21) Appl. No.: 14/578,906

(22) Filed: Dec. 22, 2014

(65) Prior Publication Data

US 2016/0183409 A1    Jun. 23, 2016

(51) Int. Cl.
*H05K 7/20*    (2006.01)

(52) U.S. Cl.
CPC ...... *H05K 7/20281* (2013.01); *H05K 7/20263* (2013.01); *H05K 7/20272* (2013.01)

(58) Field of Classification Search
CPC ................. H05K 7/20281; H05K 7/20272; H05K 7/20263; H05K 7/20981; F28D 13/00; F28D 15/0266; F28F 3/04; F28F 9/02; H01L 23/4735; H01L 23/473; F21V 29/30; F21V 29/56; H01F 27/10; H01F 27/105; H01F 27/12; H01F 27/125; H01F 27/16
USPC ............... 361/688–723; 165/104.28, 104.31, 165/104.33
See application file for complete search history.

(56) References Cited

U.S. PATENT DOCUMENTS 1,929,824 A    10/1933  Polley
4,268,850 A    5/1981   Lazarek
(Continued)

FOREIGN PATENT DOCUMENTS

DE    19646195      5/1998
WO    2004027232    4/2004

OTHER PUBLICATIONS

International Search Report for Application No. PCT/US15/64678 dated Feb. 3, 2016.
(Continued)

*Primary Examiner* — Anthony Haughton
*Assistant Examiner* — Yahya Ahmad
(74) *Attorney, Agent, or Firm* — Dinsmore & Shohl LLP

(57) ABSTRACT

Power electronics modules having modular jet impingement assembly utilized to cool heat generating devices are disclosed. The modular jet impingement assemblies include a modular manifold having a distribution recess, one or more angled inlet connection tubes positioned at an inlet end of the modular manifold that fluidly couple the inlet tube to the distribution recess and one or more outlet connection tubes positioned at an outlet end of the modular manifold that fluidly coupling the outlet tube to the distribution recess. The modular jet impingement assemblies include a manifold insert removably positioned within the distribution recess and include one or more inlet branch channels each including an impinging slot and one or more outlet branch channels each including a collecting slot. Further a heat transfer plate coupled to the modular manifold, the heat transfer plate comprising an impingement surface including an array of fins that extend toward the manifold insert.

20 Claims, 15 Drawing Sheets

(56) References Cited

U.S. PATENT DOCUMENTS

| | | | |
|---|---|---|---|
| 4,631,573 A | 12/1986 | Sutrina | |
| 5,406,807 A * | 4/1995 | Ashiwake | H01L 23/427 165/908 |
| 5,548,907 A * | 8/1996 | Gourdine | B01J 19/2405 34/448 |
| 6,213,195 B1 | 4/2001 | Downing | |
| 6,830,619 B2 | 12/2004 | Shirley | |
| 7,190,580 B2 | 3/2007 | Bezama | |
| 7,353,859 B2 | 4/2008 | Stevanovic et al. | |
| 7,886,816 B2 | 2/2011 | Ouyang | |
| 8,120,915 B2 | 2/2012 | Pautsch et al. | |
| 8,208,258 B2 | 6/2012 | Campbell | |
| 8,263,006 B2 | 9/2012 | Sutherland | |
| 2002/0070745 A1 | 6/2002 | Johnson | |
| 2003/0121649 A1 | 7/2003 | Seiler | |
| 2005/0241806 A1 | 11/2005 | Liu | |
| 2006/0250773 A1 * | 11/2006 | Campbell | H01L 23/4735 361/699 |
| 2008/0264604 A1 * | 10/2008 | Campbell | F28F 3/02 165/80.4 |
| 2010/0032142 A1 | 2/2010 | Copeland | |
| 2012/0138281 A1 | 6/2012 | Santini | |
| 2012/0152498 A1 | 6/2012 | Lyon | |
| 2012/0267086 A1 | 10/2012 | Yanik | |
| 2014/0168799 A1 | 6/2014 | Hubert et al. | |
| 2015/0348869 A1 * | 12/2015 | Joshi | H01L 23/4735 361/700 |

OTHER PUBLICATIONS

Sarangi, S., et al. (2014). "Manifold microchannel heat sink design using optimization under uncertainty." International Journal of Heat and Mass Transfer, 69: 92-105.

Mohammadi, M., et al. (2013). "Numerical study of flow uniformity and pressure characteristics within a microchannel array with triangular manifolds." Computers & Chemical Engineering, 52(0): 134-144.

Husain, A. and K. Kwang-Yong (2013). "Design Optimization of Manifold Microchannel Heat Sink Through Evolutionary Algorithm Coupled With Surrogate Model." Components, Packaging and Manufacturing Technology, IEEE Transactions on 3(4): 617-624.

Wang, Y. and G. F. Ding (2008). "Experimental investigation of heat transfer performance for a novel microchannel heat sink." Journal of Micromechanics and Microengineering, 18(3): 035021.

Parallel and series cooling method at flat type plate of mold base, http://mould-technology.blogspot.in/2008/02/paralel-and-series-cooling-methode-at.html.

* cited by examiner

MODULAR JET IMPINGEMENT ASSEMBLIES WITH PASSIVE AND ACTIVE FLOW CONTROL FOR ELECTRONICS COOLING

STATEMENT REGARDING FEDERALLY SPONSORED RESEARCH OR DEVELOPMENT

This invention was made with government support under Cooperative Agreement DE-EE0006429 awarded by the United States Department of Energy. The government has certain rights in the invention.

TECHNICAL FIELD

The present specification generally relates to jet impingement assemblies and, more particularly, to modular jet impingement assemblies having active and passive fluid flow control features.

BACKGROUND

Heat management devices may be coupled to a heat generation device, such as a power electronics device, to remove heat and lower the operating temperature of the heat generating device. A cooling fluid may be introduced to the heat management device, where it receives heat from the heat management device, primarily through convective and/or conductive heat transfer. The cooling fluid is then removed from the heat management device, thereby removing heat from the heat generating device. In one example, fluid may be directed in a jet in a localized region at a high velocity such that the fluid impinges a surface of the heat management device coupled to the heat generating device. Further, as power electronic devices are designed to operate at increased power levels, the power electronics devices generate an increased corresponding heat flux. The increase in heat flux generated by the power electronics devices may render conventional heat sinks inadequate to reject sufficient heat to maintain a desired operating temperature in the power electronics device.

Accordingly, heat management devices that incorporate passive and active fluid flow control within jet impingement assemblies may be desired to mitigate high temperature operation of the power electronics devices.

SUMMARY

In one embodiment, a modular jet impingement assembly includes an inlet tube fluidly coupled to a fluid inlet, an outlet tube fluidly coupled to a fluid outlet, a modular manifold comprising a distribution recess, and one or more angled inlet connection tubes positioned at an inlet end of the modular manifold. The one or more angled inlet connection tubes are angled with respect to a surface of the modular manifold and fluidly couple the inlet tube to the distribution recess. The modular jet impingement assembly further includes one or more outlet connection tubes positioned at an outlet end of the modular manifold, fluidly coupling the outlet tube to the distribution recess and a manifold insert removably positioned within the distribution recess of the modular manifold. The manifold insert includes one or more inlet branch channels fluidly coupled to the one or more angled inlet connection tubes. Each inlet branch channel includes an impinging slot. The manifold insert also includes one or more outlet branch channels fluidly coupled to the one or more inlet branch channels and the one or more outlet connection tubes. Each outlet branch channel includes a collecting slot. A heat transfer plate is coupled to the modular manifold, the heat transfer plate includes an impingement surface including an array of fins that extend toward the manifold insert.

In another embodiment, a power electronics module includes a modular jet impingement assembly that includes an inlet tube fluidly coupled to a fluid inlet, an outlet tube fluidly coupled to a fluid outlet, and a modular manifold including a distribution recess and one or more angled inlet connection tubes positioned at an inlet end of the modular manifold. The one or more angled inlet connection tubes are angled with respect to a surface of the modular manifold and fluidly couple the inlet tube to the distribution recess. The modular manifold further includes one or more outlet connection tubes positioned at an outlet end of the modular manifold. The one or more outlet connection tubes fluidly couple the outlet tube to the distribution recess. A manifold insert is removably positioned within the distribution recess of the modular manifold. The manifold insert includes one or more inlet branch channels fluidly coupled to the one or more angled inlet connection tubes. Each inlet branch channel includes an impinging slot. The manifold insert also includes one or more outlet branch channels fluidly coupled to the one or more inlet branch channels and the one or more outlet connection tubes. Each outlet branch channel includes a collecting slot. A heat transfer plate is coupled to the modular manifold, the heat transfer plate includes an impingement surface including an array of fins that extend toward the manifold insert. Further, an electronics device is positioned in thermal contact with the heat transfer plate opposite the array of fins.

In yet another embodiment, a modular jet impingement assembly includes an inlet tube fluidly coupled to a fluid inlet, an outlet tube fluidly coupled to a fluid outlet, and two or more modular manifolds. Each modular manifold includes a distribution recess and one or more angled inlet connection tubes positioned at an inlet end of the modular manifold. The one or more angled inlet connection tubes are angled with respect to a surface of the modular manifold and fluidly couple the inlet tube to the distribution recess. The modular manifold further includes one or more outlet connection tubes positioned at an outlet end of the modular manifold, fluidly coupling the outlet tube to the distribution recess. The modular jet impingement assembly further includes one or more manifold inserts removably positioned within the distribution recess of each modular manifold. The one or more manifold inserts include one or more inlet branch channels fluidly coupled to the one or more angled inlet connection tubes. Each inlet branch channel includes an impinging slot. The one or more outlet branch channels are fluidly coupled to the one or more inlet branch channels and the one or more outlet connection tubes. Each outlet branch channel includes a collecting slot. One or more heat transfer plates are coupled to each modular manifold. The one or more heat transfer plates include an impingement surface including an array of fins that extend toward the manifold insert. Further, a diameter of a first angled inlet connection tube of a first modular manifold is greater than a diameter of a first angled inlet connection tube of a second modular manifold.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to power electronics modules having modular jet impingement assemblies and apparatuses that may be utilized to cool heat generating devices, such as semiconductor devices. In the embodiments described herein, jet impingement is provided by directing jets of coolant fluid at an impingement surface of a thermally conductive heat transfer plate thermally coupled to a heat generating device. Heat is transferred to the coolant fluid as it impinges the impingement surface. This may increase the operating life of the heat generating devices. The modular jet impingement assemblies include modular manifolds configured to receive manifold inserts. Further, the modular jet impingement assemblies having modular manifolds may be configured to actively and/or passively alter the mass flow rate of coolant fluid flowing along a fluid flow path formed within the modular jet impingement assemblies, which may facilitate uniform heat transfer and/or targeted heat transfer from the heat generating devices to the coolant fluid thereby removing heat flux from the heat generating devices and increasing the operating life of the heat generating devices.

Figure 1:
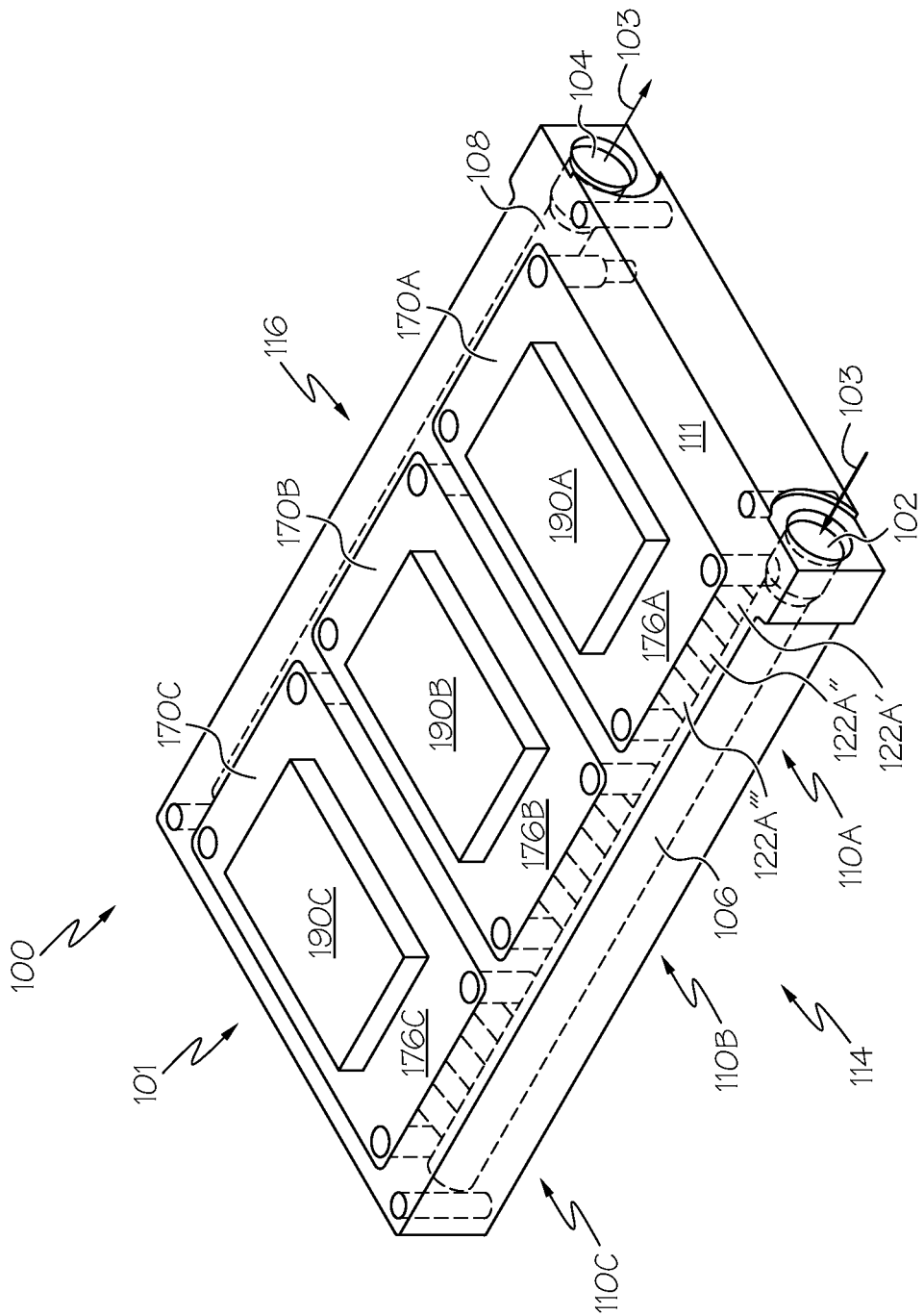
FIG. 1 schematically depicts an isometric view of an example power electronics module according to one or more embodiments shown or described herein.
Figure 2:
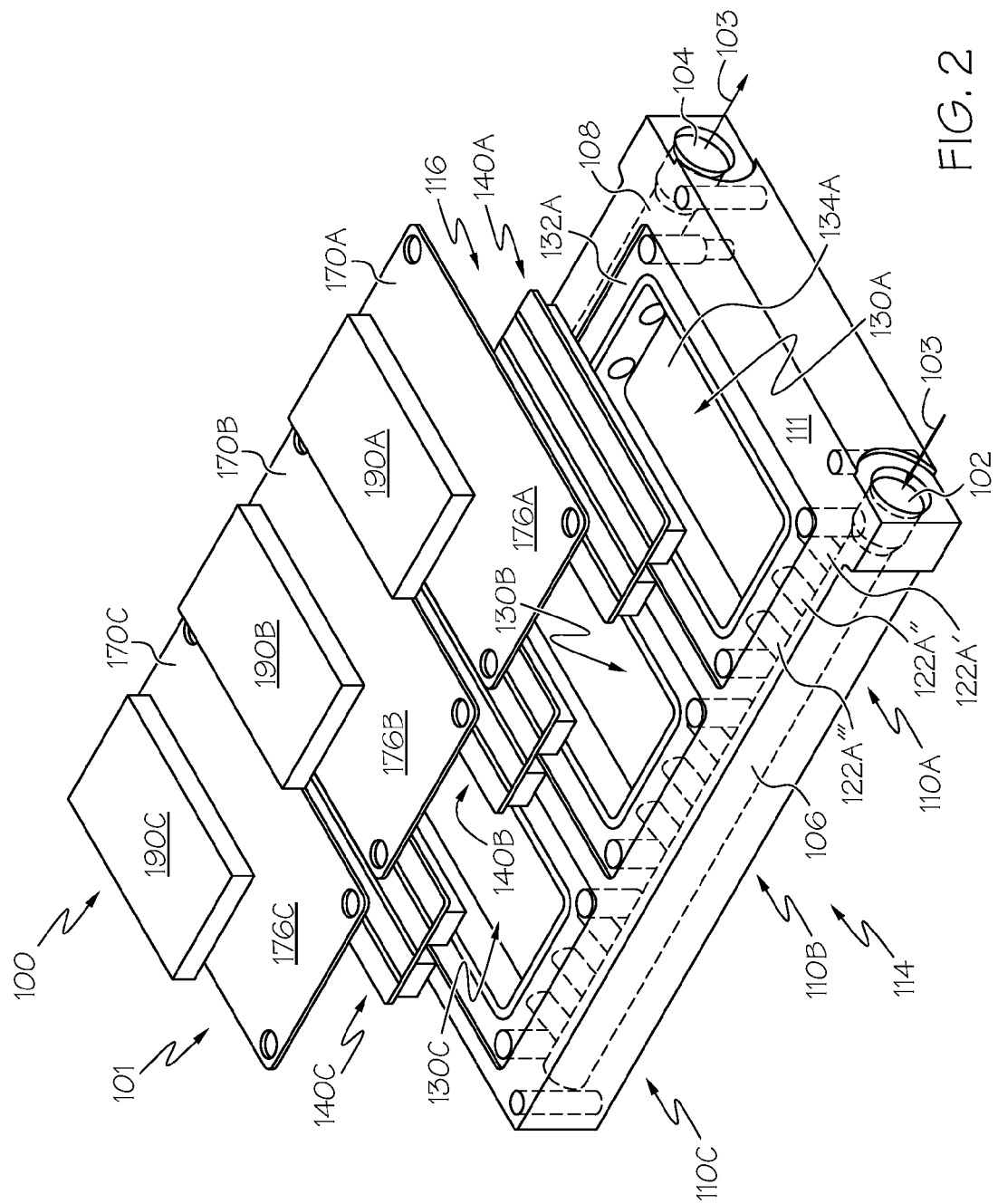
FIG. 2 schematically depicts an exploded isometric view of the power electronics module as shown in FIG. 1 according to one or more embodiments shown or described herein.
Figure 3:
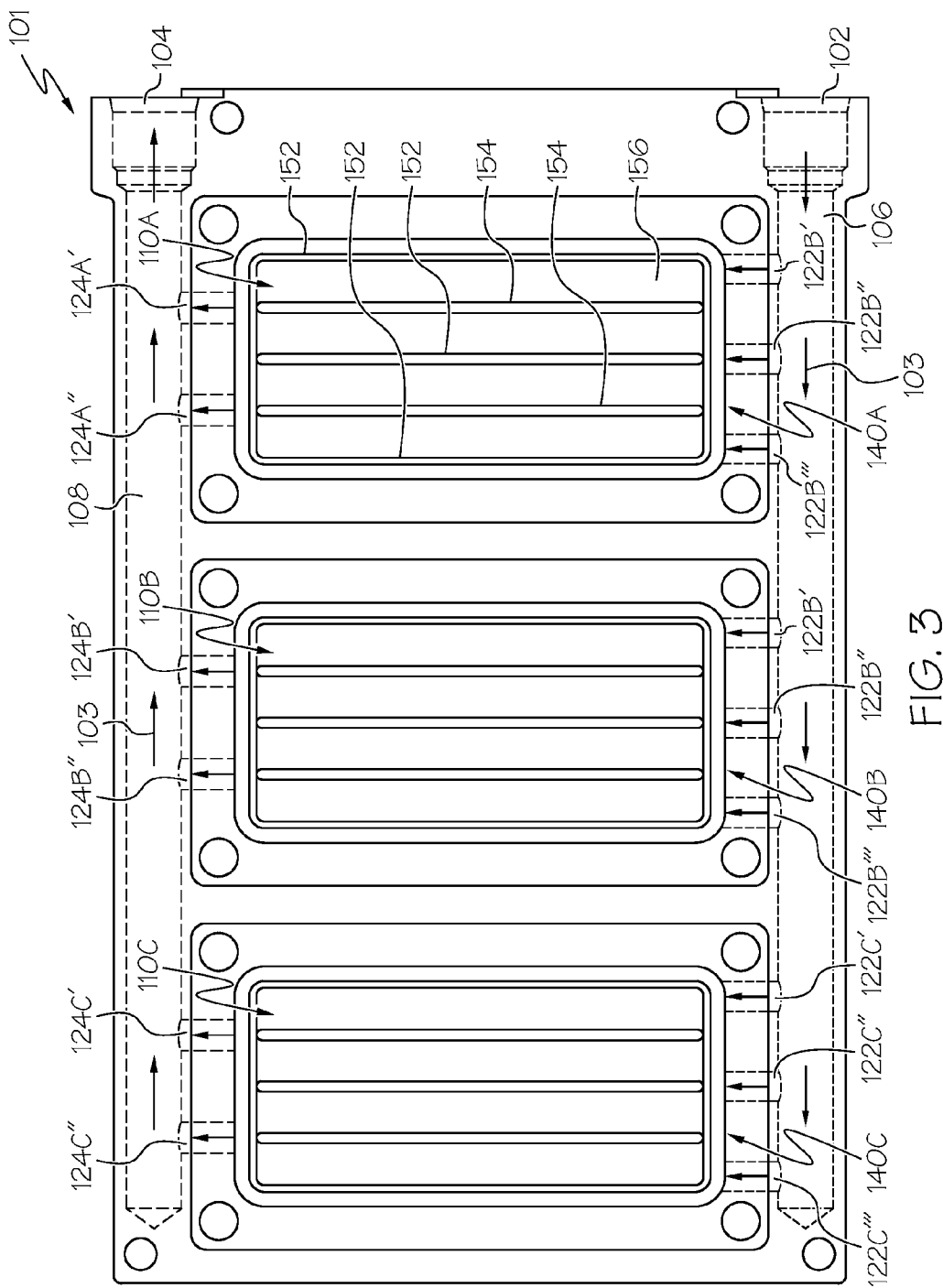
FIG. 3 schematically depicts a top view of an example modular jet impingement assembly according to one or more embodiments shown or described herein.

Referring to FIGS. 1-3, an exemplary power electronics module 100 is depicted. The power electronics module 100 depicted in FIGS. 1-3 includes a modular jet impingement assembly 101 that may be thermally coupled to one or more heat generating devices 190. The modular jet impingement assembly 101 comprises a fluid inlet 102, a fluid outlet 104, an inlet tube 106, an outlet tube 108, one or more modular manifolds 110, one or more manifold inserts 140, and one or more heat transfer plates 170. In the embodiment depicted in FIG. 1-3, the modular jet impingement assembly 101 comprises a first modular manifold 110A, a second modular manifold 110B, and a third modular manifold 110C integrally connected such that the inlet tube 106 and the outlet tube 108 extend through each of the modular manifolds 110A-110C. In other embodiments, (for example, the embodiment depicted in FIGS. 8-15), the modular manifolds 110A-110C are removably coupled. It should be understood that any number of modular manifolds 110 are contemplated and the three modular manifold (110A-110C) embodiment is described herein merely as an illustrative embodiment. In some embodiments, each modular manifold 110A-110C may be made from a generally thermally conductive material, for example and without limitation, copper, aluminum, steel, thermally enhanced composite materials, polymeric composite materials, graphite, molded plastic, or the like.

Additionally, the modular jet impingement assembly 101, including each modular manifold 110A-110C, may be manufactured using 3D printing, additive manufacturing, and the like, for example, fusion deposition modeling. Further, it should be understood that throughout this disclosure, the first modular manifold 110A, and components associated therewith are described for illustrative purposes and the description may apply to any of the one or more modular manifolds 110.

Referring still to FIGS. 1-3, the inlet tube 106 may be positioned on an inlet side 114 of the modular jet impingement assembly 101 and may fluidly couple the fluid inlet 102 and the modular manifolds 110A-110C. The outlet tube 108 may be positioned on an outlet side 116 of the modular jet impingement assembly 101 and may fluidly couple the fluid outlet 104 and the modular manifolds 110A-110C. In the embodiments depicted in FIGS. 1-3, the inlet tube 106 and the outlet tube 108 may comprise a single tube extending along the modular manifolds 110A-110C. Further, in embodiments in which the modular manifolds 110A-110C are removably coupled together (FIGS. 8-15), each individual modular manifold 110 may comprise a portion of the inlet tube 106 and a portion of the outlet tube 108 fluidly coupled to the fluid outlet 104.

As described in more detail below, a coolant fluid may enter the modular jet impingement assembly 101 through the fluid inlet 102 and exit the modular jet impingement assembly 101 through fluid outlet 104. The modular jet impingement assembly 101 may be fluidly coupled to a coolant reservoir (not shown), for example, in operation, the coolant fluid may follow a fluid flow path 103 and traverse the inlet tube 106, the modular manifolds 110A-110C, one or more manifold inserts 140A-140C, contact one or more heat transfer plates 170A-170C, and exit through the outlet tube 108. The coolant fluid may be any appropriate liquid, such as deionized water or radiator fluid. Other exemplary fluids include, for example and without limitation, water, organic solvents, and inorganic solvents. Examples of such solvents may include commercial refrigerants such as R-134a, R717, and R744. Selection of the composition of the coolant fluid used in association with the power electronics module 100 may be selected based on, among other properties, the boiling point, the density, and the viscosity of the fluid.

Referring now to FIG. 2, each individual modular manifold 110A-110C comprises one or more distribution recesses 130A-130C positioned between the inlet side 114 and the outlet side 116 of the modular jet impingement assembly 101. The one or more distribution recesses 130A-130C are fluidly coupled to the inlet tube 106 on the inlet side 114 and the outlet tube 108 on the outlet side 116. For example, as depicted in FIG. 2, the first modular manifold 110A comprises a first distribution recess 130A, the second modular manifold 110B comprises a second distribution recess 130B, and the third modular manifold 110C comprises a third distribution recess 130C. Referring specifically to the first distribution recess 130A for ease of understanding, the first distribution recess 130A comprises an insert receiving portion 134A and a heat transfer plate receiving portion 132A. The heat transfer plate receiving portion 132A circumscribes the insert receiving portion 134A. As described below, the insert receiving portion 134A is configured to receive and house a first manifold insert 140A and the heat transfer plate receiving portion 132A is configured to receive and house a first heat transfer plate 170A, positioned proximate and covering the first manifold insert 140.

Referring once again to FIGS. 1-3, the first modular manifold 110A further comprises one or more angled inlet connection tubes 122A'-122A''' and one or more outlet connection tubes 124A'-124A''. In the embodiments depicted in FIGS. 1-3, the first modular manifold 110A comprises a first angled inlet connection tube 122A', a second angled inlet connection tube 122A'', and a third angled inlet connection tube 122A''', each fluidly connecting the inlet tube 106 and the distribution recess 130A. Further, the first modular manifold 110A comprises a first outlet connection tube 124A' and a second outlet connection tube 124A'', each fluidly connecting the distribution recess 130A with the outlet tube 108. It should be understood that the one or more modular manifolds 110 may comprise any number of angled inlet connection tubes 122 and any number of outlet connection tubes 124. Further, it should be understood that description of the angled inlet connection tubes 122A'-122A''' and outlet connection tube 124A'-124A'' of the first modular manifold 110A also describe the embodiments of the corresponding components of the second modular manifold 110B, the third modular manifold 110C, and any additional modular manifolds 110.

The angled inlet connection tubes 122A'-122A''' are positioned at the inlet side 114 of the first modular manifold 110A and extend between and fluidly couple the inlet tube 106 and the distribution recess 130A and may be an inlet path for coolant fluid entering the distribution recess 130A. Further, the outlet connection tubes 124A'-124A'' are positioned at the outlet side 116 of the first modular manifold 110A and extend between and fluidly couple the distribution recess 130A with the outlet tube 108 and may be an outlet path for coolant fluid exiting the distribution recess 130A. Additionally, the one or more angled inlet connection tubes 122A'-122A''' are angled with respect to a surface 111 of the modular manifold 110 between about 5° and about 25°, such as, for example, about 10°, about 15°, and about 20°. In some embodiments, the angle of the angled inlet connection tubes 122 may be uniform or non-uniform. For example, the first angled inlet connection tube 122A' may have a different angle than the second angled inlet connection tube 122A'', the third angled inlet connection tube 122A''', or both. Further, the angled inlet connection tubes 122A'-122A''' of the first modular manifold 110A may have a different angle than the angled inlet connection tubes 122B'-122B''' and 122C'-122C''' of the second modular manifold 110B and the third modular manifold 110C, respectively. By angling the inlet connection tubes 122'-122''', the flow resistance of the fluid flow path 103 may be altered. For example, angled inlet connection tubes 122'-122''' having larger angles may provide more flow resistance than angled inlet connection tubes 122'-122''' having smaller angles. In some embodiments, it may be desirable to provide angled inlet connection tubes 122'-122''' having angles that facilitate uniform flow resistances and uniform mass flow rates and, in other embodiments, it may be desirable to provide angled inlet connection tubes 122'-122''' having angles that facilitate non-uniform flow resistances and non-uniform mass flow rates, for example, to provide targeted cooling to one or more heat generating devices 190.

Referring now to FIG. 3, the geometry, for example, the cross sectional area, the diameter, or the like, of each angled inlet connection tube 122'-122''' may provide passive mass flow rate control of the fluid flow path 103 through the modular jet impingement assembly 101. In some embodiments, the diameters of each angled inlet connection tube 122'-122''' are uniform or non-uniform. For example, the diameters of each angled inlet connection tube 122'-122''' may be non-uniform with respect to the angled inlet connection tubes 122'-122''' of one individual modular manifold 110 (e.g., the first modular manifold 110A). Further, the diameters of each angled inlet connection tube 122'-122''' may be non-uniform with respect to all angled inlet connection tubes 122'-122''' within the modular jet impingement assembly 101 (e.g., the angled inlet connection tubes 122'-122''' associated with the first modular manifold 110A, the second modular manifold 110B, and the like).

In some embodiments, the diameter of each angled inlet connection tube 122'-122''' may be computationally determined by an optimization process, for example, the diameter of each angled inlet connection tube 122 may be optimized to control the mass flow rate of the coolant fluid along the fluid flow path 103. For example, the diameter of each angled inlet connection tube 122 may facilitate uniform coolant fluid flow into each modular manifold 110A-110C or facilitate targeted coolant fluid flow into each distribution manifold of the modular manifolds 110 to provide more or less cooling to different heat generating devices 190 thermally coupled to the modular manifolds 110. Similarly, the diameter of each angled inlet connection tube 122 may vary based on the cooling requirements of a particular application. For example, smaller diameters may be used to provide less coolant fluid into modular manifolds 110 coupled to heat generating devices 190 requiring less heat transfer and larger diameters may be used to provide more coolant fluid into modular manifolds 110 coupled to heat generating devices 190 requiring more heat transfer.

Referring now to FIGS. 2-5B, the modular jet impingement assembly 101 further comprises one or more manifold inserts 140 removably positioned within the distribution recess 130 of each individual modular manifold 110. In the embodiments depicted in FIGS. 2-5B, three manifold inserts 140A-140C are depicted, however, it should be understood that any number of manifold inserts 140 are contemplated. In some embodiments, each individual manifold insert 140 may be removably positioned within each individual distribution recess 130 of each individual modular manifold 110. In other embodiments, multiple manifold inserts 140 may be removably positioned within individual distribution recesses 130. For example, as depicted in FIG. 2, a first manifold insert 140A is removably positioned within the first distribution recess 130A of the first modular manifold 110A, a second manifold insert 140B is removably positioned within the second distribution recess 130B of the second modular manifold 110B, and a third manifold insert 140C is removably positioned within the third distribution recess 130C of the third modular manifold 110C.

Figure 4B:
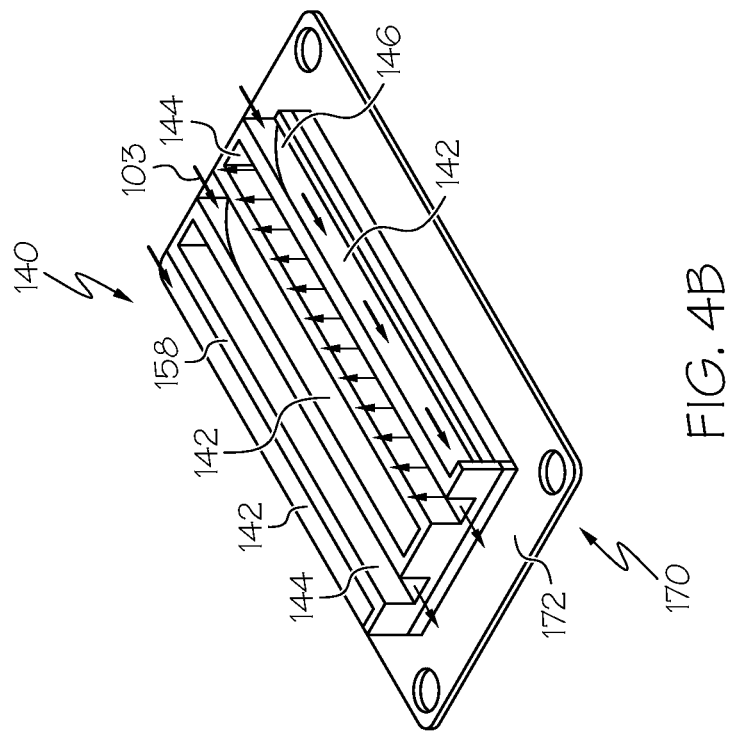
FIG. 4B schematically depicts an isometric view of another embodiment of a manifold insert positioned adjacent a heat transfer plate according to one or more embodiments shown or described herein.
Figure 4A:
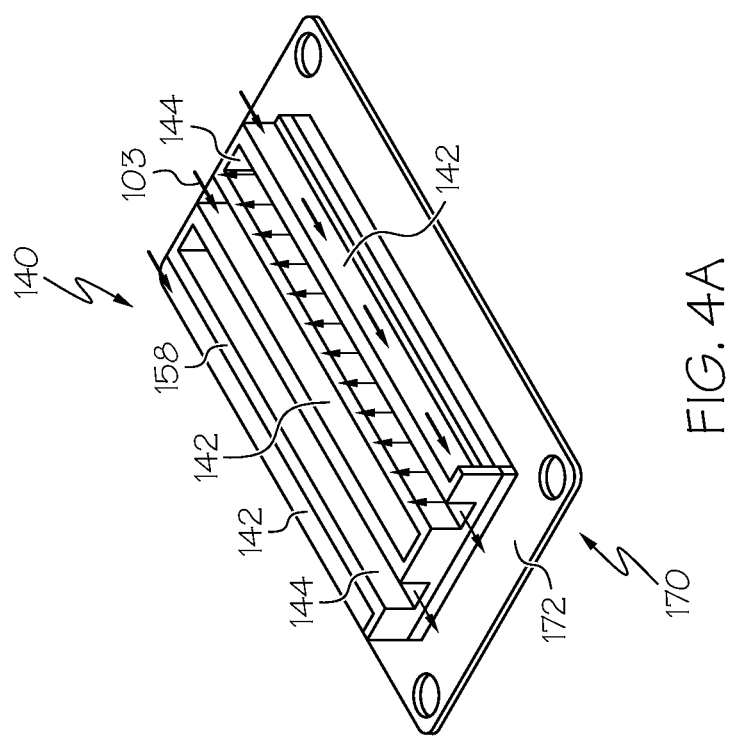
FIG. 4A schematically depicts an isometric view of a manifold insert positioned adjacent a heat transfer plate according to one or more embodiments shown or described herein.

Referring now to FIGS. 4A-4B, isometric views of two exemplary manifold inserts 140 are depicted. The manifold inserts 140 each comprise one or more inlet branch channels 142 and one or more outlet branch channels 144. The one or more inlet branch channels 142 are fluidly coupled to the one or more angled inlet connection tubes 122 when the individual manifold insert 140 is positioned within the distribution recess 130 of the individual modular manifold 110, thereby defining a portion of the fluid flow path 103. Further, the one or more outlet branch channels are fluidly coupled to the one or more outlet connection tubes 124 when the individual manifold insert 140 is positioned within the distribution recess 130 of the individual modular manifold 110, thereby defining another portion of the fluid flow path 103. The one or more inlet branch channels 142 and the one or more outlet branch channels 144 may be alternately positioned within the manifold insert 140 such that each inlet branch channel 142 is positioned adjacent at least one outlet branch channel 144 and each outlet branch channel 144 is positioned adjacent at least one inlet branch channel 142. Further, the manifold inserts 140 comprise a channel surface 158 positioned proximate the distribution recess 130 when the manifold insert 140 is disposed within the distribution recess 130 and a slot surface 156 (FIG. 5A) positioned proximate the heat transfer plate 170 when the heat transfer plate 170 is coupled to the modular manifold 110.

In some embodiments, for example the embodiment depicted in FIG. 4B, the one or more of the inlet branch channels 142 comprise one or more tapered portions 146. For example, a tapered portion 146 may be aligned with the one or more angled inlet connection tubes 122 and may be configured to alter the mass flow rate of coolant fluid traversing the fluid flow path 103. Further, in other embodiments, one or more of the outlet branch channels 144 may also comprise one or more tapered portions. It should be understood that the one or more inlet branch channels 142 and the one or more outlet branch channels 144 may take a variety of configurations including having a variety of slopes, lengths, discontinuous portions, non-linear portions, and the like without departing from the scope of the present disclosure.

Figure 5B:
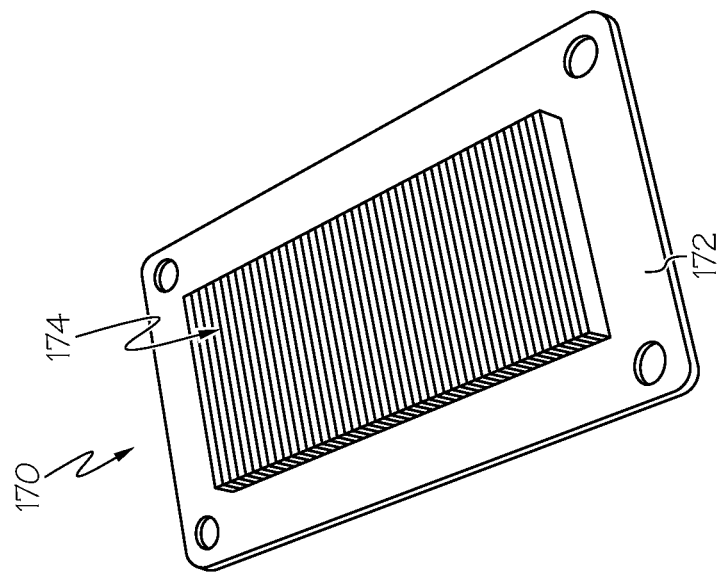
FIG. 5B an isometric view of a heat transfer plate positioned such that an impingement surface of the heat transfer plate having an array of fins is visible according to one or more embodiments shown or described herein.
Figure 5A:
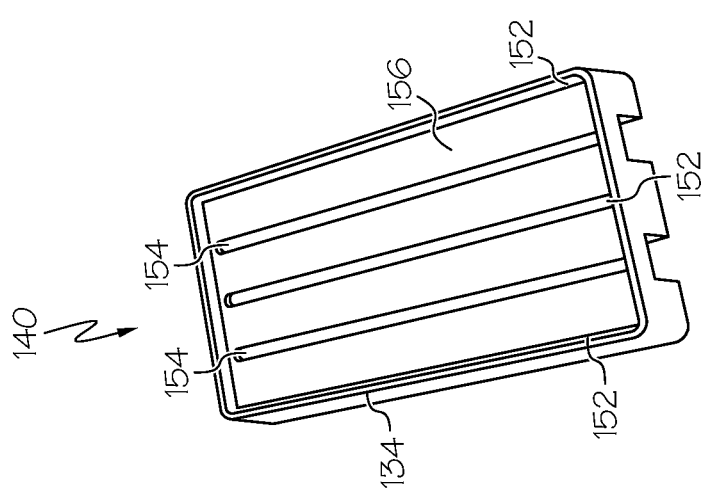
FIG. 5A schematically depicts an isometric view of an embodiment of the manifold insert depicting a slot surface of the manifold insert according to one or more embodiments shown or described herein.

Referring also to FIG. 5A, an isometric view of an embodiment of the manifold insert 140 depicting a slot surface 156 of the manifold insert 140 is depicted. As shown in FIG. 5A, the one or more manifold inserts 140 further comprise one or more impinging slots 152 fluidly coupled to the one or more inlet branch channels 142 and may form a throughput portion of the manifold insert 140 such that coolant fluid may pass through the impinging slot 152, for example, as jets of coolant fluid. Further, the impinging slots 152 may comprise uniform or non-uniform shapes and cross-sectional areas and may take a variety of sizes and shapes to provide jets of coolant fluid to impinge the heat transfer plate 170 and transfer heat from the heat transfer plate 170 to the coolant fluid, as described below. In operation, the impinging slots 152 facilitate jet impingement from the manifold inserts 140 to the heat transfer plates 170.

Referring again to FIG. 5A, one or more manifold inserts 140 further comprise one or more collecting slots 154 fluidly coupled to the one or more outlet branch channels 144 and may form additional throughput portions of the manifold insert 140 such that coolant fluid may pass through the collecting slots 154. The collecting slots 154 are in fluid communication with the impinging slots 152 such that coolant fluid that exits the manifold insert 140 through an individual impinging slot 152 reenters the manifold insert 140 through an individual collecting slot 154, for example, an adjacent collecting slot 154. Further, the collecting slots 154 may comprise uniform or non-uniform shapes and cross-sectional areas and may take a variety of sizes and shapes to collect coolant fluid after it impinges the heat transfer plate 170 and transfer heat from the heat transfer plate 170.

Referring again to FIGS. 1-5B, the modular jet impingement assembly 101 may further comprise one or more heat transfer plates 170 coupled to the one or more modular manifolds 110. For example, in the embodiments depicted in FIGS. 1 and 2, a first heat transfer plate 170A is removably coupled to the first modular manifold 110A, a second heat transfer plate 170B is removably coupled to the second modular manifold 110B, and a third heat transfer plate 170C is removably coupled to the third modular manifold 110C. Further, it should be understood that any number of modular manifold 110 and any number of heat transfer plates 170 are contemplated. For example, in some embodiments, two or more heat transfer plates 170 may be coupled to an individual modular manifolds 110 and in other embodiments, an individual heat transfer plate 170 may be coupled to two or more modular manifolds 110. Further, the heat transfer plates 170 may also be made from a thermally conductive material, for example and without limitation, copper, aluminum, steel, thermally enhanced composite materials, polymeric composite materials, graphite, or the like.

Referring to FIG. 5B, an isometric view of a heat transfer plate 170 is depicted such that an impingement surface 172 of the heat transfer plate 170 having an array of fins 172 is visible. Each individual heat transfer plate 170 comprises the impingement surface 172 having the array of fins 174 that extend towards the modular manifold 110, for example, toward the slot surface 156 of the manifold insert 140 removably positioned within the distribution recess 130 of the modular manifold 110. The array of fins 174 may be proximate to the manifold insert 140, and in some embodiments, the array of fins 174 may contact the slot surface 156 of the manifold insert 140. The heat transfer plate 170 may be positioned within the heat transfer plate receiving portion 132 of the distribution recess 130 and the impingement surface 172, including the array of fins 174, extends towards the manifold insert 140 such that the array of fins 174 are positioned proximate the impinging slots 152 and the collecting slots 154 of the manifold insert 140, forming an impingement chamber therebetween.

In operation, the array of fins 174 receive coolant fluid from the impinging slots 152 and the array of fins 174 direct coolant fluid toward the collecting slots 154. For example, in some embodiments, the impingement surface 172 may further include one or more grooves that may direct coolant fluid flow through the impingement chamber. The one or more grooves may be positioned within the array of fins 174. For example, the one or more grooves may run substantially parallel and proximate the impinging slots 152 and the collecting slots 154 of the manifold insert 140 and may direct coolant fluid between impinging slots 152 and collecting slots 154. Further, the heat transfer plate 170 may be coupled to the heat transfer plate receiving portion 132 through any appropriate connection, creating a fluid-tight seal between the modular manifold 110 and the heat transfer plate 170, forming the impingement chamber therebetween. Example connections include, but are not limited to, gaskets and mechanical fasteners, o-rings, soldering, brazing, ultrasonic welding, and the like. As described in more detail below, the one or more arrays of fins 174 can correspond to the locations of the one or more heat generating devices 190 positioned proximate the heat transfer plate 170.

Referring again to FIG. 5B, the one or more arrays of fins 174 increase the local surface area of the heat transfer plate 170, such that coolant fluid delivered to the heat transfer plate 170 may efficiently convect heat away from the heat transfer plate 170. By increasing the surface area of the heat transfer plate 170, the heat transfer rate from the heat transfer plate 170 to the coolant fluid may be enhanced. In some embodiments, the heat transfer plate 170, including the one or more arrays of fins 174, may have a variety of configurations including being made from uniform, isotropic materials, non-isotropic materials, composite materials, or the like. In some embodiments, the one or more arrays of fins 174 of the heat transfer plate 170 may include a coating, for example, a porous coating, that increases the surface area of the one or more arrays of fins 174, thereby increasing heat transfer away from the heat transfer plate 170. In some embodiments, the one or more arrays of fins 174 may be constructed from a porous material. Additionally, it should be understood that in some embodiments, the heat transfer plates 170 may not be provided with the one or more arrays of fins 174.

As stated above, the modular jet impingement assembly 101 may include one or more gaskets (not shown) positioned between the modular manifold 110 and the heat transfer plate 170, for example, between the heat transfer plate receiving portion 132 of the distribution recess 130 and the impingement surface 172 of the heat transfer plate 170. The one or more gaskets may provide a fluid-tight seal between adjacent components of modular jet impingement assembly 101 such that coolant fluid introduced to the modular jet impingement assembly 101 may be maintained in a closed-loop cooling system as the coolant fluid circulates through the modular jet impingement assembly 101. The gaskets may be made from a variety of materials that provide a fluid-tight seal between the generally non-compliant bodies of the modular jet impingement assembly 101. Examples of such materials include, without limitation, natural or synthetic elastomers, compliant polymers such as silicone, and the like. The one or more gaskets may also be made from an assembly that includes compliant materials and non-compliant materials, such that the one or more gaskets provide desired sealing characteristics while maintaining their geometric configuration. In other embodiments, gaskets are not utilized, such as embodiments where soldering or brazing is used to couple the modular manifolds 110 and the heat transfer plates 170.

Referring again to FIGS. 1-3, a heat transfer surface 176 of the heat transfer plate 170 is depicted. The heat transfer surface 176 is opposite the impingement surface 172. As stated above, the heat transfer surface 176 may be thermally coupled to one or more heat generating devices 190 at locations on the heat transfer plate 170 corresponding with the array of fins 174 of the impingement surface 172. The heat transfer surface 176 operates to transfer heat from the heat generating device 190 to the heat transfer plate 170, including the one or more arrays of fins 174. Heat transferred to the heat transfer plate 170 by the one or more heat generating devices 190 can be transferred to coolant fluid flowing through the modular jet impingement assembly 101. In one embodiment, the heat generating devices 190 are thermally coupled to the heat transfer surface 176 of the heat transfer plate 170 via an intermediate, thermally conductive substrate layer (not shown) (for example and without limitation, thermal paste, epoxy, direct bonded copper (DBC), direct bonded aluminum (DBA), or similar materials). The heat generating devices 190 may be bonded to the substrate layer by bonding techniques such as soldering, transient liquid phase bonding (TLP), or nano-silver sintering, for example. In some embodiments, the heat generating devices 190 are not bonded to the heat transfer surface 176 of a heat transfer plate 170 but rather just positioned adjacent thereto. As described in more detail below, each heat transfer plate 170 is cooled using jet impingement, providing cooling to the heat generating devices 190.

Heat generating devices 190 may include, but are not limited to, electronics devices such as semiconductor devices, insulated gate bipolar transistors (IGBT), metal-oxide-semiconductor field effect transistors (MOSFET), power diodes, power bipolar transistors, and power thyristor devices. As an example and not a limitation, the heat generating device 190 may be a component in an inverter and/or converter circuit used to electrically power high load devices, such as electric motors in electrified vehicles (e.g., hybrid vehicles, plug in hybrid electric vehicles, plug in electric vehicles, and the like).

Figure 6:
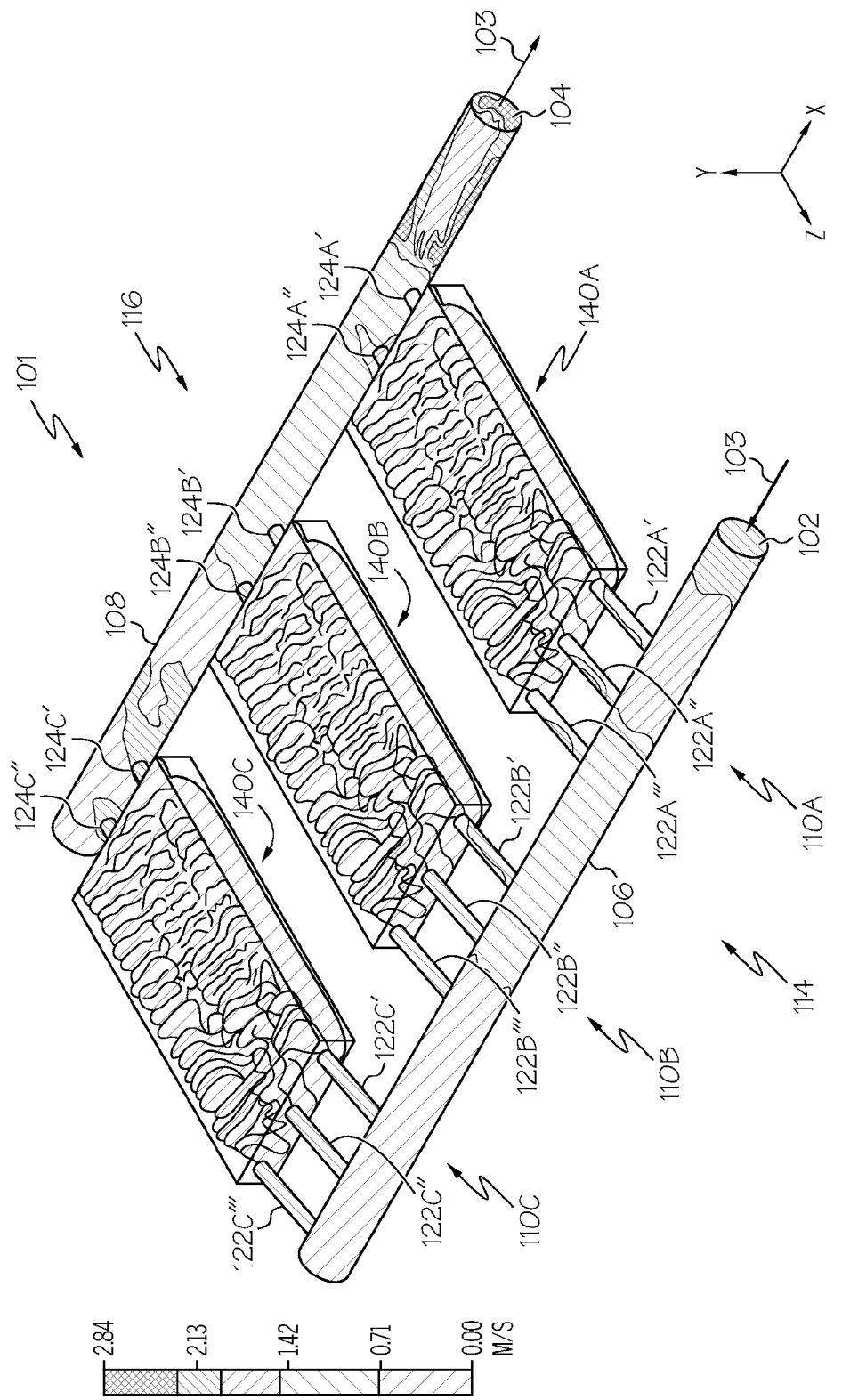
FIG. 6 schematically depicts a mass flow rate of an example coolant fluid traversing an example modular jet impingement assembly according to one or more embodiments shown or described herein.

Referring now to FIG. 6, the mass flow rate and fluid flow path 103 of an exemplary embodiment of the modular jet impingement assembly 101 is schematically depicted. In the embodiment depicted in FIG. 6, the diameters of the three angled inlet connection tubes 122'-122''' of each modular manifold 110A-110C are 5 mm, 6 mm, and 5 mm, respectively. In this embodiment, a flow volume percentage (i.e., the percentage of the total coolant fluid that flows through an individual modular manifold 110 in operation) through each of the three modular manifolds 110A-110C is varied such that more coolant fluid flows through the first modular manifold 110A, less coolant fluid flows through the second modular manifold 110B, and still less coolant fluid flows through the third modular manifold 110C. For example, in this embodiment, the flow volume percentage through the first modular manifold 110A was calculated to be about 38.3%, the flow volume percentage through the second modular manifold 110B was calculated to be about 32.1%, and the flow volume percentage through the third modular manifold 110C was calculated to be about 29.5%. It should be understood that these values relate to a specific exemplary embodiment and provide non-limiting examples of angled inlet connection tube 122 diameter sizes. In other embodiments, the angled inlet connection tubes may comprise any contemplated diameter, for example, between about 2-10 mm, such as about 3 mm, 5 mm, and 7 mm.

In another embodiment, the diameters of the three angled inlet connection tubes 122'-122''' of the modular manifolds 110A-110C are varied between each of the modular manifolds 110A-110C. For example, in one embodiment, the diameters of the three angled inlet connection tubes 122A'-122A''' of the first modular manifold 110A comprise about 5 mm, 6 mm, and 5 mm, respectively, the diameters of the three angled inlet connection tubes 122B'-122B''' of the second modular manifold 110B comprise about 4.7 mm, 5.5 mm, and 4.7 mm, respectively, and the diameters of the three angled inlet connection tubes 122C'-122C''' of the third modular manifold 110C comprise about 4.5 mm, 5 mm, and 4.5 mm, respectively. In this embodiment, the mass flow percentage through the first modular manifold 110A was calculated to be about 34.1%, the mass flow percentage through the second modular manifold was calculated to be about 32.8%, and the mass flow percentage through the third modular manifold was calculated to be about 33.1%.

In this embodiment, the diameters of respective angled inlet connection tubes 122'-122''' of each modular manifold 110A-110C are smaller, the farther the modular manifold 110A-110C is from the fluid inlet 102. This creates a more uniform mass flow rate through each modular manifold 110A-110C. The uniform mass flow rate allows coolant fluid to be applied evenly to each modular manifold 110A-110C, for example, to provide uniform cooling to one or more heat generating devices 190. In contrast, in the embodiment described previously, the diameters of respective angled inlet connection tubes 122'-122' of each modular manifold 110A-110C are uniform across the modular manifolds 110A-110C. This creates a non-uniform mass flow rate through each modular manifold 110A-110C. The non-uniform mass flow rate through each modular manifold 110A-110C allows more coolant fluid to be applied to particular modular manifolds 110A-110C, for example to provide targeted cooling to one or more heat generating devices 190. It should be understood that these values relate to a specific exemplary embodiment and provide non-limiting examples of angled inlet connection tube 122 diameter sizes. In other embodiments, the angled inlet connection tubes may comprise any contemplated diameter, for example, between about 2-10 mm, such as about 3 mm, 5 mm, and 7 mm. It should be understood that by altering the diameters of the angled inlet connection tubes 122, the mass flow rate of the coolant fluid traversing the modular manifolds 110 may be altered.

Additionally, in some embodiments, the mass flow rate of the coolant fluid along the fluid flow path 103 may be altered by one or more porous media portions positioned within the inlet tube 106, the outlet tube 108, and/or one or more angled inlet connection tubes. The one or more porous media portions alter the porosity of the fluid flow path 103 and alter the mass flow rate of coolant fluid through the modular jet impingement assembly 101. The porous media portions may comprise a cylindrical porous media having a diameter substantially similar to the inlet tube 106. In some embodiments, one or more porous media portions may be positioned within the one or more angled inlet connection tubes 122. Porous media portions may comprise, for example, a metal foam, a porous ceramic, a porous glass, and/or a porous plastic, for example, polyethylene, polypropylene, polytetrafluoroethylene, polyvinylidene, ethyl vinyl acetate, and the like.

Figure 7C:
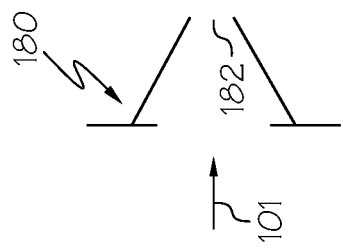
FIG. 7A schematically depicts an isometric view of a valve configured to be positioned within a modular jet impingement assembly according to one or more embodiments shown or described herein.
FIG. 7B schematically depicts the valve of FIG. 7A in a closed position according to one or more embodiments shown or described herein FIG. 7C schematically depicts the valve of FIG. 7A in an open position according to one or more embodiments shown or described herein FIG. 8 schematically depicts an exploded isometric view of an example power electronics module comprising a plurality of removably attachable modular manifolds according to one or more embodiments shown or described herein.
Figure 7B:
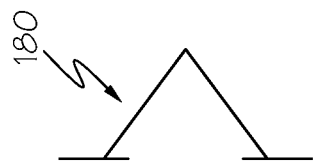
Figure 7A:
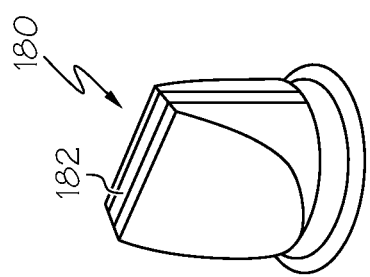

Referring now to FIG. 7A, a valve 180 comprising a valve inlet 182 is depicted. One or more valves 180 may be positioned within or adjacent the one or more angled inlet connection tubes 122 to alter the cross sectional area of the one or more angled inlet connection tubes 122. By altering the cross sectional area of the angled inlet connection tubes 122, the mass flow rate of coolant fluid entering the distribution manifold 130 may be altered. Valves 180 comprising valve inlets 182 having a smaller cross sectional area allow less coolant fluid to enter the distribution manifold 130 and valves 180 comprising valve inlets 182 having a larger cross sectional area allow more coolant fluid to enter the distribution manifold 130. Referring now to FIG. 7B, a schematic view of the valve 180 is depicted in a closed position, for example, when no coolant fluid is flowing through the valve 180. Referring now to FIG. 7C, a schematic view of the valve 180 is depicted in an open position. The valve 180 may be in the open position when coolant fluid is flowing through the valve 180.

In some embodiments, the valves 180 may comprise an electro active polymer having an adjustable rigidity and may be strengthened or weakened in response to a received electronic signal. For example, a positive potential and/or a negative potential may be applied to the electro-active polymer. The adjustable rigidity of the one or more valves 180 may alter the flow resistance of the one or more valves 180. When an individual valve 180 comprising electro active polymer is strengthened, less coolant fluid is able to flow through the valve inlet 182 and when the valve comprising electro active polymer is weakened, more coolant fluid is able to flow through the valve inlet 182.

Some embodiments of the modular jet impingement assembly 101 may further comprise a feedback loop controller communicatively coupled to the modular jet impingement assembly 101, for example, communicatively coupled to one or more valves 180 positioned within the modular jet impingement assembly 101. In some embodiments, the feedback loop controller comprises a proportional-integral-derivative (PID) feedback loop controller. Additionally, the feedback loop controller may be communicatively coupled with one or more temperature sensors and one or more pressure sensors configured to monitor the temperature and pressure of one or more components of the modular jet impingement assembly 101 and one or more heat generating devices 190 thermally coupled to the modular jet impingement assembly 101. The feedback loop controller may provide a signal to the one or more valves 180 to adjust the rigidity of the one or more valves 180 to actively control the mass flow rate of the coolant fluid in response to received temperature and or pressure signals. For example, the feedback loop controller may weaken the rigidity of one or more valves 180 to provide more coolant fluid to an individual modular manifold 110 in response to a high measured temperature of the individual modular manifold 110.

Referring once again to FIGS. 1-3, operation of the modular jet impingement assembly 101 will now be described. Coolant fluid flows through the inlet tube 106 such that a portion of coolant fluid enters each modular manifold 110A-110C, in a parallel flow pattern. In other embodiments, as described below (e.g., FIG. 11), the coolant fluid may enter each modular manifold 110A-110C iteratively in a series flow pattern. The volume of coolant fluid that enters each modular manifold 110A-110C may be passively controlled as described above, for example, by altering the inlet geometry (e.g., diameter) of the angled fluid connection tubes 122, positioning one or more valves 180 within the fluid flow path 103, and/or positioning one or more porous media portions within the fluid flow path 103. The volume of coolant fluid that enters each modular manifold 110A-110C may also be actively controlled using the feedback loop controller communicatively coupled to the one or more valves 180, as described above. Further, the fluid inlet 102 and the fluid outlet 104 may be coupled to a fluid reservoir (not shown) that houses coolant fluid. The fluid reservoir can provide coolant fluid to the modular jet impingement assembly 101 through the fluid inlet 102 and cool heated coolant fluid when it returns to the fluid reservoir through the fluid outlet 104, preparing the coolant fluid for reuse.

More specifically, referring to the first modular manifold 110A depicted in FIGS. 1-3 for ease of understanding, coolant fluid enters the modular jet impingement assembly 101 through the fluid inlet 102, traverses the inlet tube 106, and enters the first distribution recess 130A of the first modular manifold 110A through each of the angled inlet connection tubes 122A'-122A''' fluidly coupled to the first distribution recess 130A. When the manifold insert 140A is positioned with the distribution recess 130A, coolant fluid introduced into the first distribution recess 130A enters the inlet branch channels 142 of the first manifold insert 140A and passes through the impinging slots 152, forming a jet of coolant fluid that is ejected through the manifold insert 140A toward the heat transfer plate 170A.

When coolant fluid passes through the impinging slot 152, it forms a jet of coolant fluid directed at the array of fins 174 positioned on the impingement surface 172 of the heat transfer plate 170. The jet of coolant fluid impinges the array of fins 174 and transfers heat from the array of fins 174 to the coolant fluid. After impinging the one or more arrays of fins 174 of the heat transfer plate 170, the heated coolant fluid flows away from the one or more arrays of fins 174 within the impingement chamber and reenters the manifold insert 140 through the collecting slot 154, for example, through an adjacent collecting slot 154 and into an outlet branch channel 144. Additionally, the outlet connection tubes 124A' and 124A'' are positioned downstream from the distribution recess 130A and fluidly couple the outlet branch channels 144 and the distribution recess 130A with the outlet tube 108 of the modular jet impingement assembly 101. The coolant fluid then flows through the fluid outlet 104 and travels to the fluid reservoir where the coolant fluid is prepared for reuse.

Figure 8:
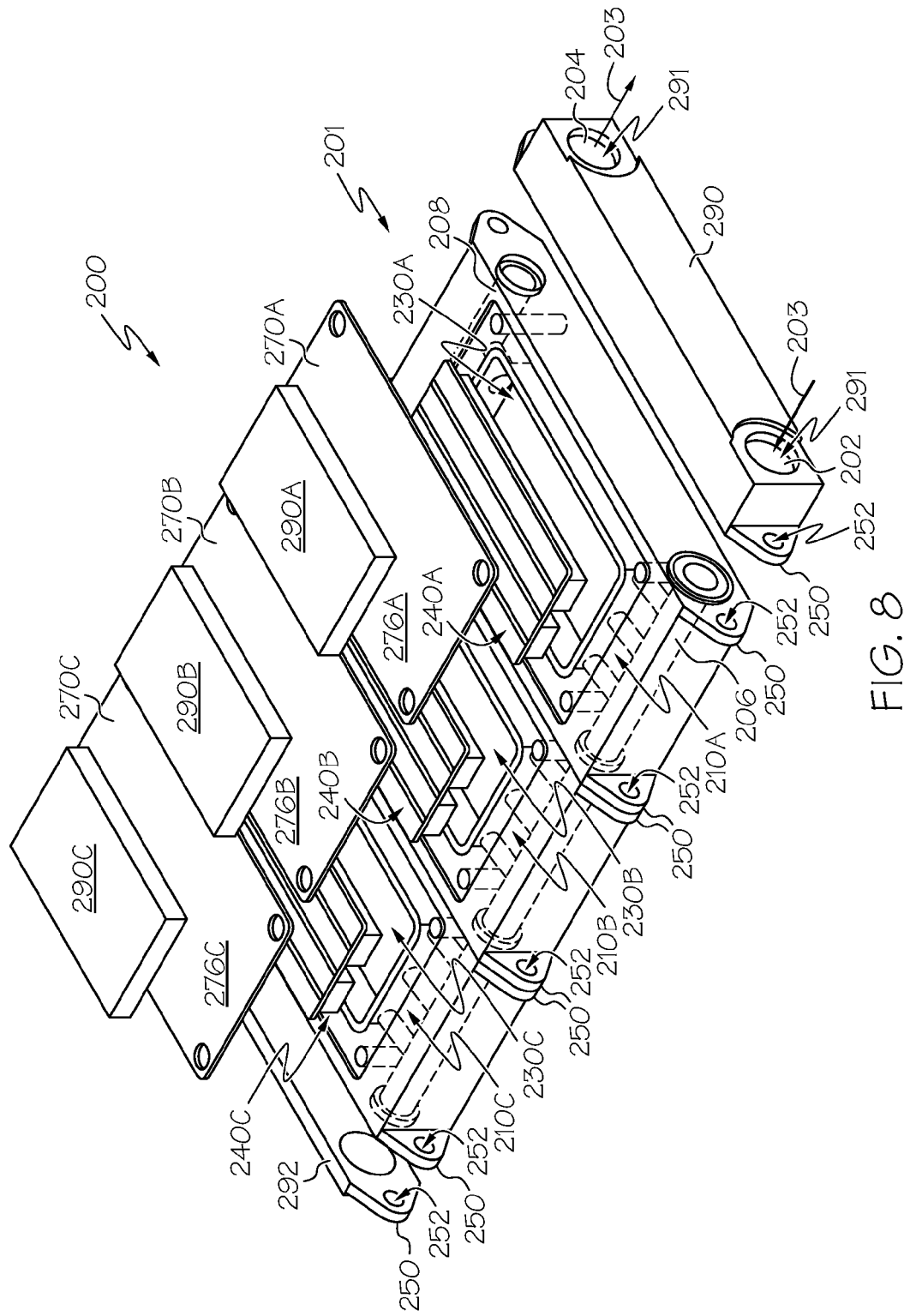

Referring now to FIG. 8, a power electronics module 200 including a modular jet impingement assembly 201 is depicted comprising a plurality of removably coupled modular manifolds 210. In this embodiment, three removably coupled modular manifolds 210A-210C are depicted, however, it should be understood that any number of modular manifolds 210 are contemplated. The modular manifolds 210A-210C comprise the same components as the modular manifolds 110A-110C described above. Further, one or more manifold inserts 240A-240C may be positioned within the distribution manifolds 230A-230C of each of the modular manifolds 210A-210C and one or more heat transfer plates 270A-270C may be coupled to the modular manifolds 210A-210C, as described above. Further, the one or more heat transfer plates 270A-270C may be thermally coupled to one or more heat generating devices 290A-290C.

Figure 9:
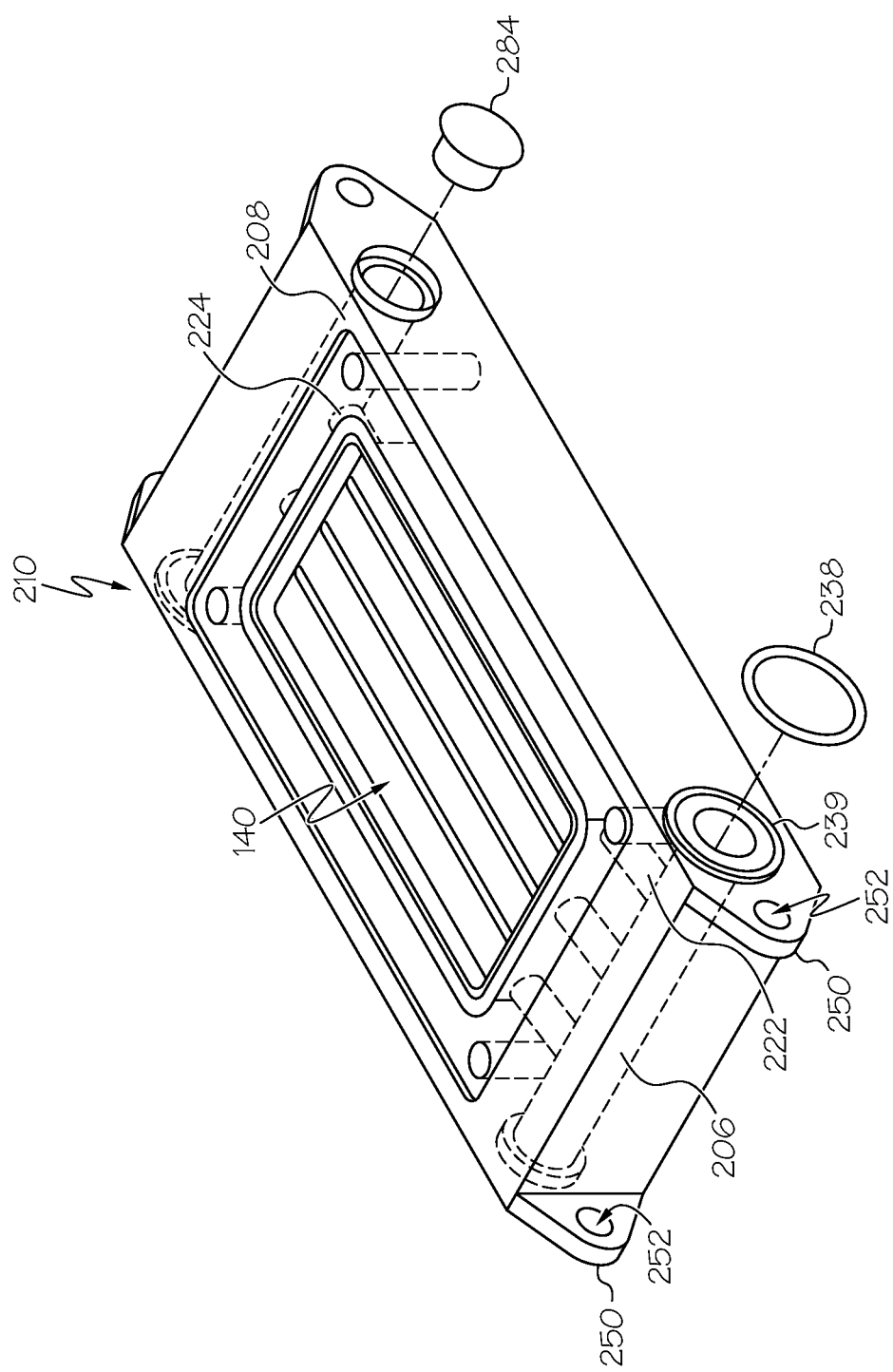
FIG. 9 schematically depicts an isometric view of an example embodiment of an individual removably attachable modular manifold of FIG. 8 according to one or more embodiments shown or described herein.
Figure 15:
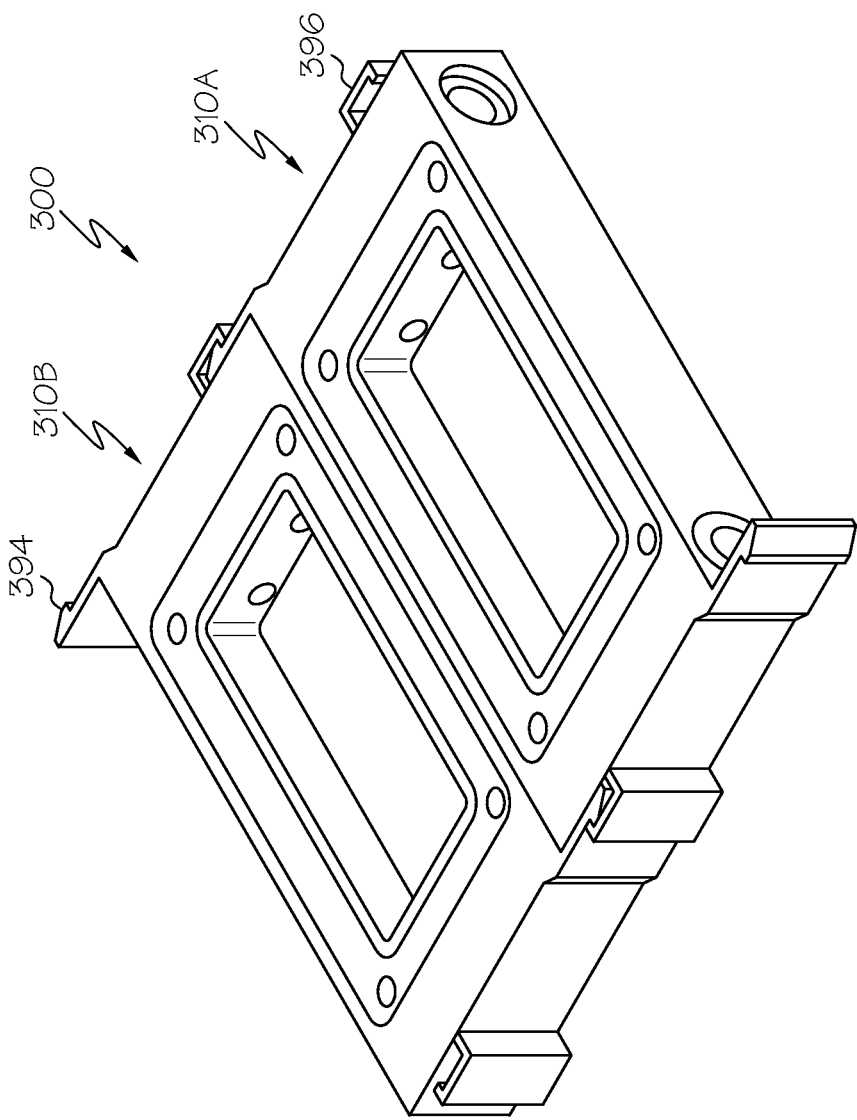
FIG. 15 schematically depicts an isometric view of an example modular jet impingement assembly comprising a plurality of removably attachable modular manifolds coupled in a snap fit arrangement according to one or more embodiments shown or described herein.

The modular jet impingement assembly 201 further comprises an inlet tube 206 having a plurality of discrete portions traversing each modular manifold 210 and an outlet tube 208 having a plurality of discrete portions traversing each modular manifold 210. When the one or more modular manifolds 210 are coupled together, the inlet tubes 206 and the outlet tubes 208 may be fluidly coupled to form a continuous fluid flow path 203. The individual modular manifolds 210 may be coupled using a fastener engagement, for example, a flange and bolt arrangement as depicted in FIGS. 8-9, or a snap fit engagement, as depicted in FIG. 15. In embodiments comprising the flange and bolt arrangement depicted in FIGS. 8 and 9, each individual modular manifold 210 may comprise one or more flanges 250 that each include a flange hole 252 disposed through the flange 250. In embodiments in which multiple modular manifolds 210 are coupled together, flanges 250 of adjacent modular manifolds 210 may be aligned. To couple the adjacent modular manifolds 210, a bolt can be disposed through the flange holes 252 of the flanges 250 of adjacent modular manifolds 210.

Referring now to FIG. 9, in these embodiments, an O-ring 238 may be positioned between adjacent inlet tubes 206 and adjacent outlet tubes 208. The O-ring 238 may be positioned within an O-ring groove 239 of each modular manifold 210 circumscribing the inlet tube 206 and/or the outlet tube 208, providing a fluid-tight seal between adjacent modular manifolds 210. Additionally, as depicted in FIG. 8, the modular jet impingement assembly 201 may comprise one or more fitting caps 290 and may comprise an end cap 292. The one or more fitting caps 290 may be coupled to one or more modular manifolds 210, for example, as depicted in FIG. 8, the first modular manifold 210A. Further, the one or more fitting caps 290 and the one or more end caps 292 may include flanges 250 and flange holes 252 which may be aligned with the flanges 250 and flange holes 252 of adjacent modular manifolds 210 allowing one or more fitting caps 290, one or more end caps 292, or a combination of both, to be coupled to one or more modular manifolds 210. The one or more fitting caps 290 also comprise one or more throughputs 291 which may be used as the fluid inlet 202 and/or the fluid outlet 204. The end cap 292 may be coupled to one of the modular manifolds 210, for example, as depicted in FIG. 8, coupled to the third modular manifold 210C and may fluidly seal one side of the modular manifold 210.

Referring to FIGS. 8 and 9, one or more plugs 284 may be removably positioned within the inlet tubes 206, the outlet tubes 208, and/or the throughputs 291 of the fitting caps 290 to fluidly block a portion of the inlet tube 206, the outlet tube 208 and/or the throughputs 291 of the fitting caps 290 to alter the fluid flow path 203. As described below, the plugs 284 may be positioned within the modular jet impingement assembly 201 to provide a customized fluid flow path 203. For example, as depicted in FIG. 9, one or more plugs 284 may be positioned between discrete portions of the inlet tubes 206 and/or the outlet tubes 208 to control the fluid flow path 203 of the coolant fluid through the modular jet impingement assembly 101. The plugs 284 may comprise a plastic, polymer, metal, or the like.

Referring now to FIGS. 10-14, in embodiments in which the modular manifolds 210 are removably coupled, the fluid flow path 203 may be altered by positioning one or more plugs 284 between adjacent discrete portions of the inlet tube 206 and/or the outlet tube 208. For example, the fluid flow path 203 may be positioned in a series flow pattern, a parallel flow pattern, or a combination thereof. Additionally, the positioning of the fitting cap 290 and the end cap 292 may alter the fluid flow path 203.

Figure 10:
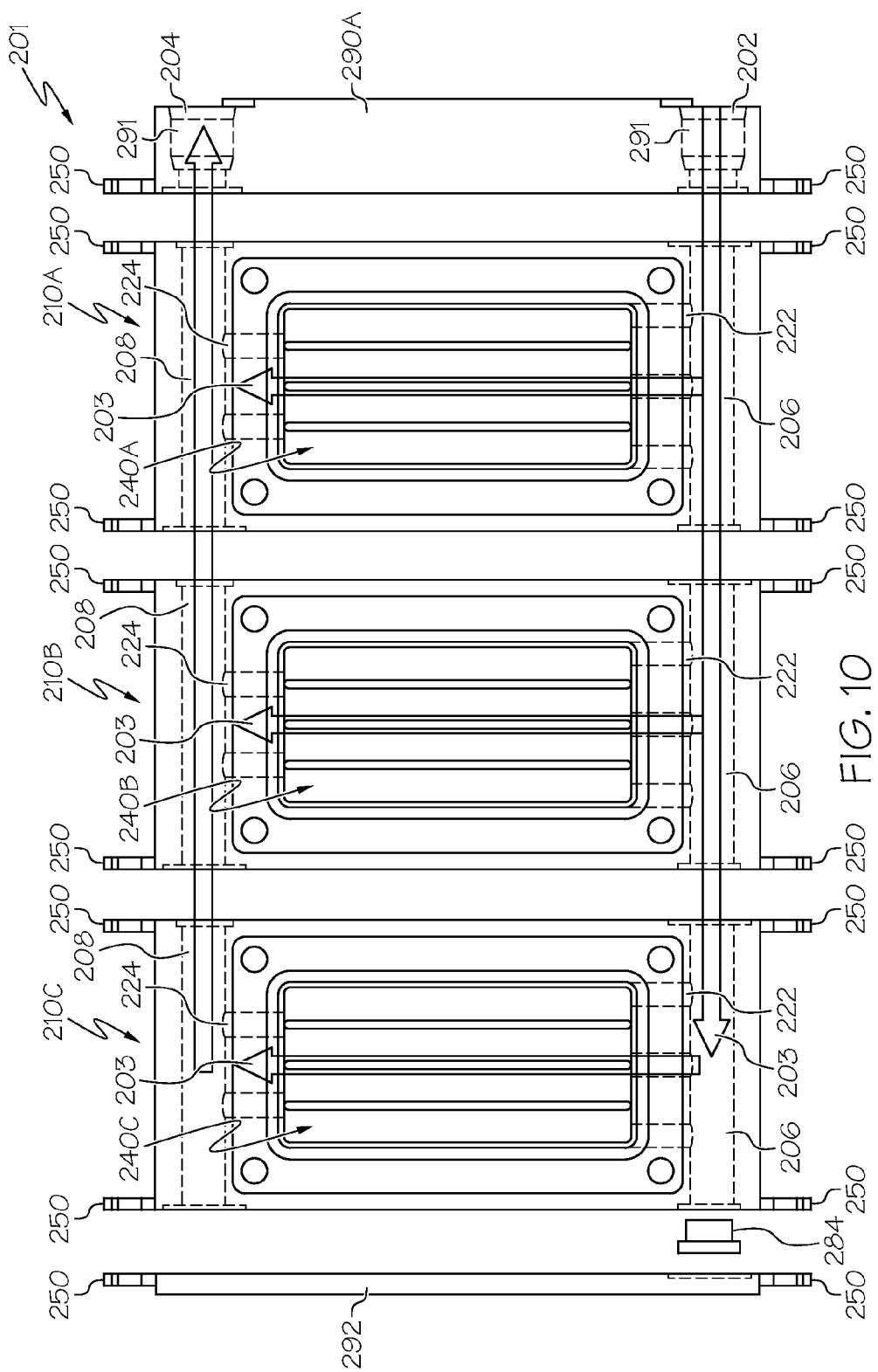
FIG. 10 schematically depicts a top view of the modular jet impingement assembly of FIG. 8 having a fluid inlet and a fluid outlet disposed through the same fitting cap and comprising a plurality of removably attachable modular manifolds arranged in parallel according to one or more embodiments shown or described herein.

Referring now to FIG. 10, an embodiment of the modular jet impingement assembly 201 is depicted comprising three removably coupled modular manifolds 210A-210C. In this embodiment, the fluid inlet 202 and the fluid outlet 204 are each positioned within the fitting cap 290A removably coupled to the first modular manifold 210A and an end cap 292 is positioned opposite the fitting cap 290A and is removably coupled to the third modular manifold 210C. Further, a plug 284 is positioned between the end cap 292 and the inlet tube 206 and in alignment with the fluid inlet 202 such that the fluid flow path 203 is configured in a parallel flow pattern. In the parallel flow pattern, a portion of the coolant fluid flows through each of the modular manifolds 210A-210C.

Figure 11:
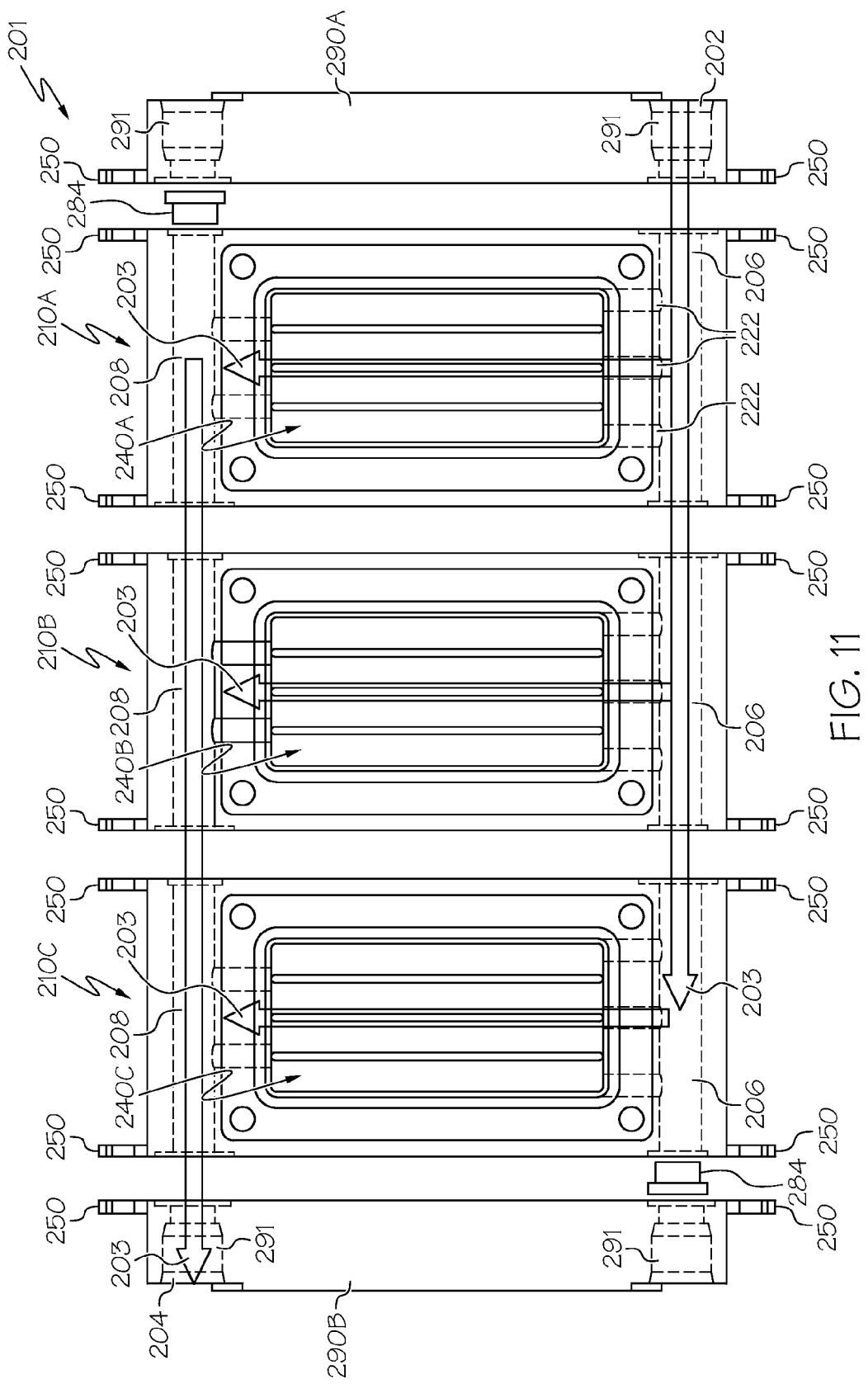
FIG. 11 schematically depicts a top view of the modular jet impingement assembly of FIG. 8 having a fluid inlet and a fluid outlet disposed through different fitting caps and comprising a plurality of removably attachable modular manifolds arranged in parallel according to one or more embodiments shown or described herein.

Referring now to FIG. 11, another embodiment of the modular jet impingement assembly 201 is depicted comprising three modular manifolds 210A-210C assembled such that the fluid inlet 202 is positioned within the fitting cap 290 coupled to the first modular manifold 210A and the fluid outlet 204 is positioned within the fitting cap 290 coupled to the third modular manifold 210C. Further, plugs 284 are positioned within unused throughputs 291 of each fitting caps 290 (i.e. the throughputs 291 that are not being used as the fluid inlet 202 or the fluid outlet 204) such that the fluid flow path 203 is configured in a parallel flow pattern and a portion of the coolant fluid flows through each of the modular manifolds 210A-210C.

Figure 12:
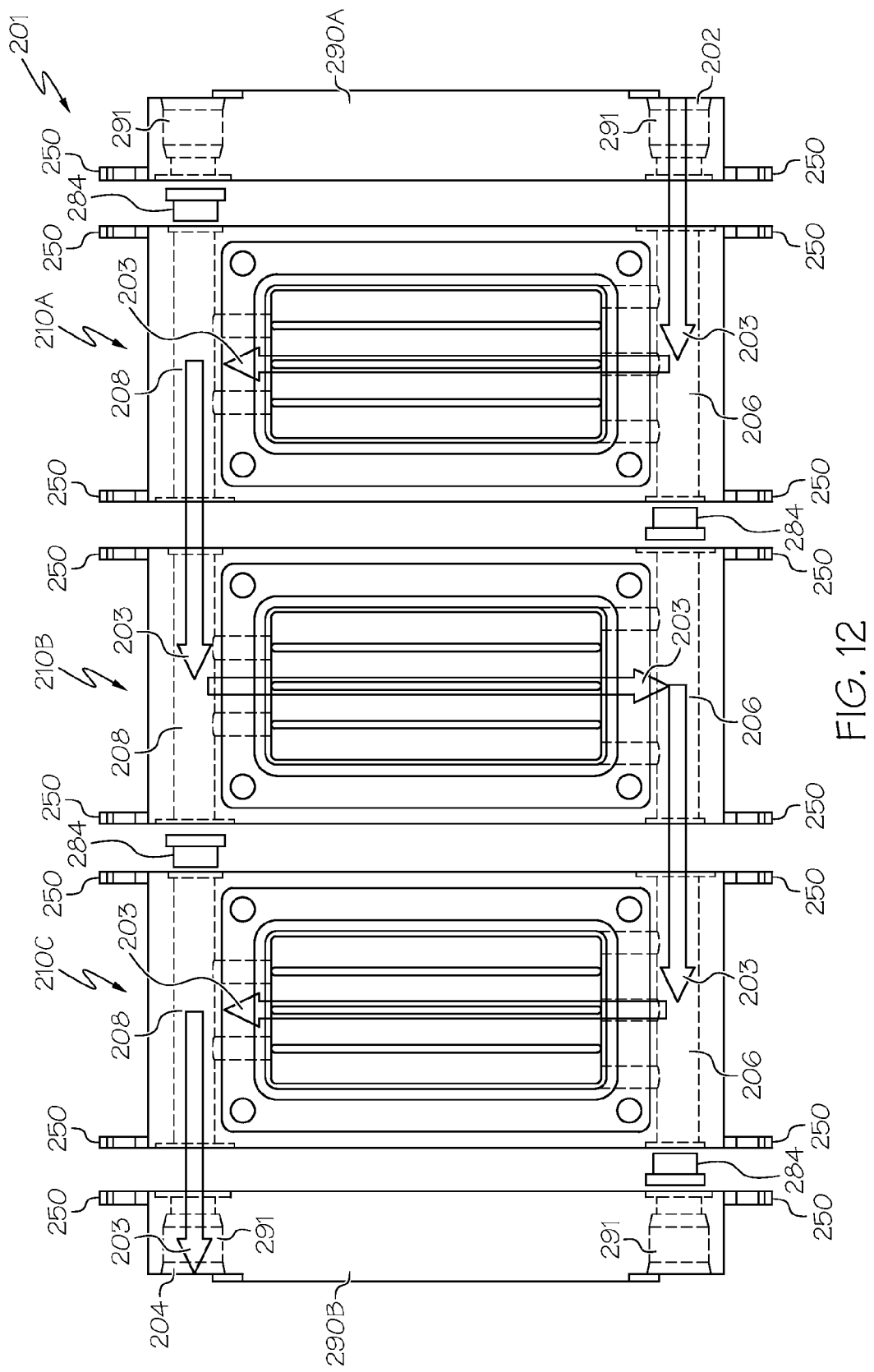
FIG. 12 schematically depicts a top view of the modular jet impingement assembly of FIG. 8 comprising a plurality of removably attachable modular manifolds arranged in series according to one or more embodiments shown or described herein.

Referring now to FIG. 12, another embodiment of the modular jet impingement assembly 201 is depicted comprising three modular manifolds 210A-210C assembled such that the fluid inlet 202 is positioned within the fitting cap 290 coupled to the first modular manifold 210A and the fluid outlet 204 is positioned within the fitting cap 290 coupled to the third modular manifold 210C. Plugs 284 are positioned within unused throughputs 291 of each fitting cap 290 (i.e. the throughputs 291 that are not being used as the fluid inlet 202 or the fluid outlet 204). Additionally, a plug 284 is positioned between the discrete portions of the inlet tube 206 that extend through the first modular manifold 210A and the second modular manifold 210B and another plug 284 is positioned between the discrete portions of the outlet tube 208 that extend through the second modular manifold 210B and the third modular manifold 210C. In this arrangement, the fluid flow path 203 is configured in a series flow pattern. In the series flow pattern, all coolant fluid that enters the fluid inlet 202 flows through each of the modular manifolds 210A-210C iteratively. For example, in operation, the coolant fluid first traverses the first modular manifold 210A, impinging the impingement surface 272 of the first heat transfer plate 270A, next traverses the second modular manifold 210B, impinging the impingement surface 272 of the second heat transfer plate 270B, next traverses the third modular manifold 210C, impinging the impingement surface 272 of the third heat transfer plate 270, and finally exits through the fluid outlet 204.

Figure 13:
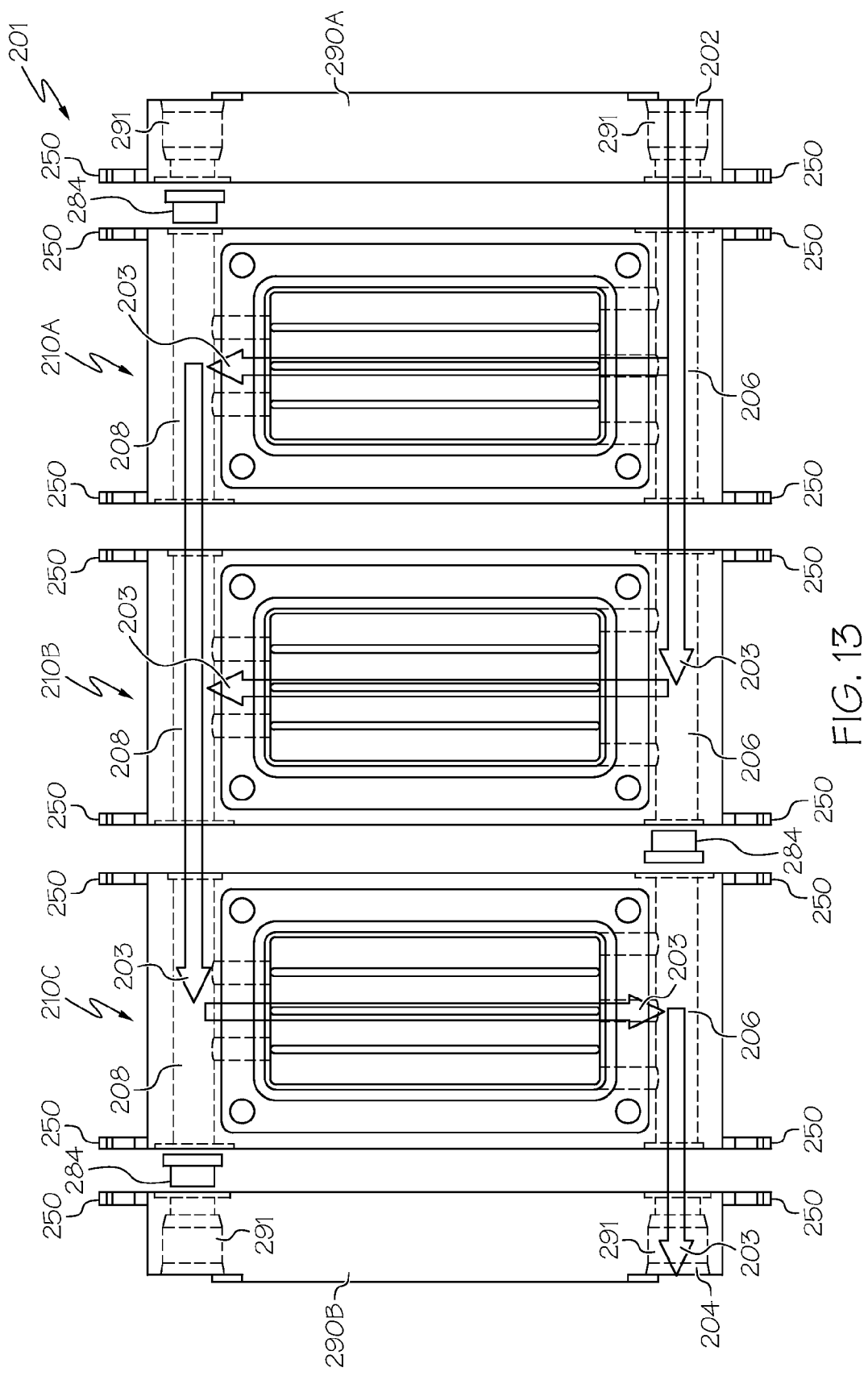
FIG. 13 schematically depicts a top view of the modular jet impingement assembly of FIG. 8 comprising a plurality of removably attachable modular manifolds arranged partially in series and partially in parallel according to one or more embodiments shown or described herein.

Referring now to FIG. 13, an embodiment of the modular jet impingement assembly 201 is depicted comprising three modular manifolds 210A-210C assembled such that the fluid flow path 203 comprises a partial series and a partial parallel flow pattern. In this embodiment, the fluid inlet 202 is positioned within the fitting cap 290 coupled to the first modular manifold 210A and the fluid outlet 204 is positioned within the fitting cap 290 coupled to the third modular manifold 210C. The fluid inlet 202 and the fluid outlet 204 are each aligned with the inlet tube 206. Plugs 284 are positioned within unused throughputs 291 of each fitting caps 290 (i.e. the throughputs 291 that are not being used as the fluid inlet 202 or the fluid outlet 204). Additionally, a plug 284 is positioned between discrete portions of the inlet tube 206 that extend through the second modular manifold 210B and the third modular manifold 210C. In this embodiment, the fluid flow path 203 traverses the first modular manifold 210A and the second modular manifold 210B in a parallel flow pattern and traverses the third modular manifold 210C is in a series flow pattern. In this embodiment, in operation, a first portion of the coolant fluid traverses the first modular manifold 210A and a second portion of the coolant fluid traverses the second modular manifold 210B substantially simultaneously. Next, all the first and second portion of the coolant fluid rejoin before traversing the third modular manifold 210C and exiting the fluid outlet 204.

Figure 14:
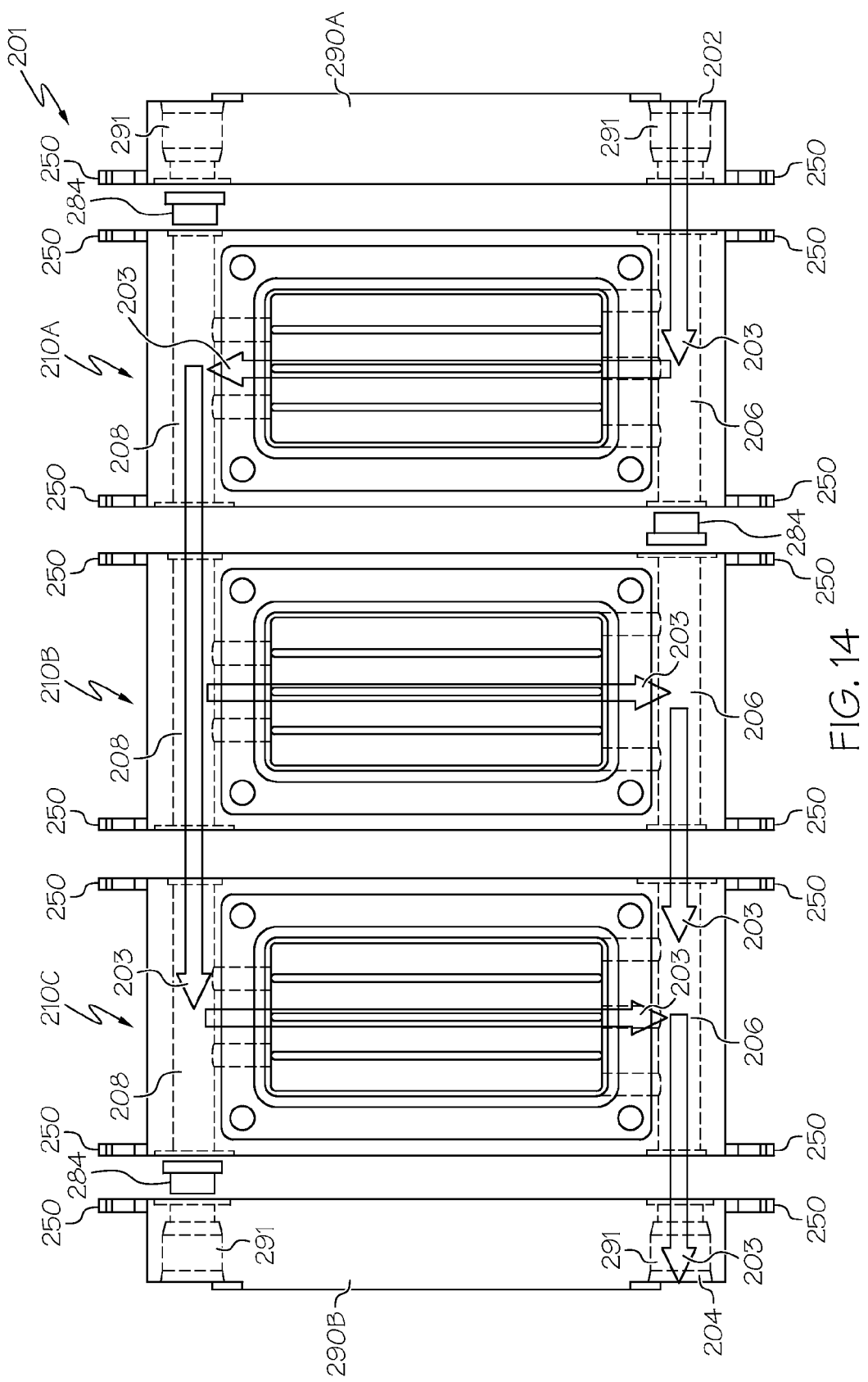
FIG. 14 schematically depicts a top view of the modular jet impingement assembly of FIG. 8 comprising a plurality of removably attachable modular manifolds arranged partially in series and partially in parallel according to one or more embodiments shown or described herein.

Referring now to FIG. 14, an embodiment of the modular jet impingement assembly 201 is depicted comprising three modular manifolds 210A-210C assembled such that the fluid flow path 203 comprises a partial series and a partial parallel flow pattern. In this embodiment, the fluid inlet 202 is positioned within the fitting cap 290 coupled to the first modular manifold 210A and the fluid outlet 204 is positioned within the fitting cap 290 coupled to the third modular manifold 210C. The fluid inlet 202 and the fluid outlet 204 are each aligned with the outlet tube 208. Plugs 284 are positioned within unused throughputs 291 of each fitting caps 290 (i.e. the throughputs 291 that are not being used as the fluid inlet 202 or the fluid outlet 204). Additionally, a plug 284 is positioned between discrete portions of the inlet tube 206 that extend through the first modular manifold 210A and the second modular manifold 210B. In this embodiment, the fluid flow path 203 traverses the first modular manifold 210A is a series flow pattern and traverses the second modular manifold 210B and the third modular manifold 210C is in a parallel flow pattern. In this embodiment, in operation, the coolant fluid first traverses the first modular manifold 210A then a first portion of the coolant fluid traverses the second modular manifold 210B and a second portion of the coolant fluid traverses the third modular manifold 210C substantially simultaneously. Next, all the first and second portion of the coolant fluid rejoin and exit the fluid outlet 204.

Referring now to FIG. 15, another embodiment of a modular jet impingement assembly 300 is depicted comprising a plurality of removably coupled modular manifolds 310 comprising a snap fit coupling configuration. In this embodiment, each modular manifold 310, (e.g., a first modular manifold 310A and a second modular manifold 310B) comprise one or more tab portions 394 and one or more hook portions 396 configured to connect in a snap-fit arrangement to create a fluid seal between the first modular manifold 310A and the second modular manifold 310B.

It should now be understood that modular jet impingement assemblies and power electronics modules incorporating modular jet impingement assemblies allow for passive and active fluid flow control to facilitate efficient transfer of heat away from heat generating devices, which may increase the life of the heat generating device. The modular jet impingement assemblies comprise an inlet tube fluidly coupled to an fluid inlet, an outlet tube fluidly coupled to a fluid outlet, one or more modular manifolds, one or more manifold inserts removably positioned within the one or more modular manifolds, and one or more heat transfer plates coupled to modular manifolds and positioned proximate the one or more manifold inserts. The modular manifolds are configured to provide jet impingement cooling to the one or more heat transfer plates. Coolant fluid flow through the modular jet impingement assemblies may be passively controlled by altering the geometry of a fluid flow path and actively controlled by positioning one or more electronically adjustable valves within the fluid flow path. Additionally, the modular manifolds of the modular jet impingement assemblies may be removably coupled such that one or more plugs can be positioned between adjacent modular manifolds to generate parallel fluid flow patterns, series fluid flow patterns, or a combination thereof.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A modular jet impingement assembly comprising:
    an inlet tube fluidly coupled to a fluid inlet;
    an outlet tube fluidly coupled to a fluid outlet;
    a modular manifold comprising:
        a distribution recess;
        one or more angled inlet connection tubes positioned at an inlet end of the modular manifold, wherein the one or more angled inlet connection tubes are angled with respect to a surface of the modular manifold and fluidly couple the inlet tube to the distribution recess; and
        one or more outlet connection tubes positioned at an outlet end of the modular manifold, fluidly coupling the outlet tube to the distribution recess;
    a manifold insert removably positioned within the distribution recess of the modular manifold, the manifold insert comprising:
        one or more inlet branch channels fluidly coupled to the one or more angled inlet connection tubes, each inlet branch channel including an impinging slot; and
        one or more outlet branch channels fluidly coupled to the one or more inlet branch channels and the one or more outlet connection tubes, each outlet branch channel including a collecting slot; and
    a heat transfer plate coupled to the modular manifold, the heat transfer plate comprising an impingement surface including an array of fins that extend toward the manifold insert.

2. The modular jet impingement assembly of claim 1 wherein the impingement surface of the heat transfer plate fluidly couples the impinging slot of the one or more inlet branch channels to the collecting slot of the one or more outlet branch channels.

3. The modular jet impingement assembly of claim 1 wherein the one or more angled inlet connection tubes comprise a first angled inlet connection tube having a first angled inlet diameter and a second angled inlet connection tube having a second angled inlet diameter that is larger than the first angled inlet diameter.

4. The modular jet impingement assembly of claim 1 wherein the one or more angled inlet connection tubes are angled with respect to the surface of the modular manifold between about 5° and about 25°.

5. The modular jet impingement assembly of claim 1 wherein at least one inlet branch channel comprises a tapered portion.

6. The modular jet impingement assembly of claim 1, further comprising one or more valves fluidly coupled to the one or more angled inlet connection tubes, wherein each of the one or more valves includes a valve inlet.

7. The modular jet impingement assembly of claim 6 wherein the one or more valves comprise an electro active polymer.

8. The modular jet impingement assembly of claim 7, wherein the one or more valves are communicatively coupled to a feedback loop controller, wherein the feedback loop controller provides a signal to the electro active polymer of the one or more valves to adjust a rigidity of the electro active polymer.

9. The modular jet impingement assembly of claim 1, further comprising one or more porous media portions positioned within the inlet tube, the one or more angled inlet connection tubes, the outlet tube, or a combination thereof.

10. The modular jet impingement assembly of claim 1, further comprising a plurality of modular manifolds and a plurality of manifold inserts wherein an individual manifold insert is positioned within an individual distribution recess of the plurality of modular manifolds.

11. The modular jet impingement assembly of claim 10 wherein a first modular manifold is removably coupled to a second modular manifold positioned adjacent the first modular manifold such that a fluid flow path through the first modular manifold and the second modular manifold comprises a parallel flow pattern.

12. The modular jet impingement assembly of claim 10 wherein a first modular manifold is removably coupled to a second modular manifold positioned adjacent the first modular manifold and one or more plugs are positioned between the first modular manifold and the second modular manifold such that a fluid flow path through the first modular manifold and the second modular manifold comprises a series flow pattern.

13. A power electronics module comprising:
    a modular jet impingement assembly comprising:
        an inlet tube fluidly coupled to a fluid inlet;
        an outlet tube fluidly coupled to a fluid outlet;
        a modular manifold comprising:
            a distribution recess;
            one or more angled inlet connection tubes positioned at an inlet end of the modular manifold, wherein the one or more angled inlet connection tubes are angled with respect to a surface of the modular manifold and fluidly couple the inlet tube to the distribution recess; and
one or more outlet connection tubes positioned at an outlet end of the modular manifold, fluidly coupling the outlet tube to the distribution recess;
a manifold insert removably positioned within the distribution recess of the modular manifold, the manifold insert comprising:
one or more inlet branch channels fluidly coupled to the one or more angled inlet connection tubes, each inlet branch channel including an impinging slot; and
one or more outlet branch channels fluidly coupled to the one or more inlet branch channels and the one or more outlet connection tubes, each outlet branch channel including a collecting slot; and
a heat transfer plate coupled to the modular manifold, the heat transfer plate comprising an impingement surface including an array of fins that extend toward the manifold insert; and
an electronics device positioned in thermal contact with the heat transfer plate opposite the array of fins.

14. The power electronics module of claim 13 wherein the impingement surface of the heat transfer plate fluidly couples the impinging slot of the one or more inlet branch channels to the collecting slot of the one or more outlet branch channels.

15. The power electronics module of claim 13 wherein the one or more angled inlet connection tubes comprise a first angled inlet connection tube having a first angled inlet diameter and a second angled inlet connection tube having a second angled inlet diameter that is larger than the first angled inlet diameter.

16. The power electronics module of claim 13, further comprising a plurality of modular manifolds and a plurality of manifold inserts wherein an individual manifold insert is positioned within an individual distribution recess of the plurality of modular manifolds.

17. The power electronics module of claim 16 wherein a first modular manifold is removably coupled to a second modular manifold positioned adjacent the first modular manifold such that a fluid flow path through the first modular manifold and the second modular manifold comprises a parallel flow pattern or a series flow pattern.

18. A modular jet impingement assembly comprising:
an inlet tube fluidly coupled to a fluid inlet;
an outlet tube fluidly coupled to a fluid outlet;
two or more modular manifolds, wherein each modular manifold comprises:
a distribution recess;
one or more angled inlet connection tubes positioned at an inlet end of the modular manifold, wherein the one or more angled inlet connection tubes are angled with respect to a surface of the modular manifold and fluidly couple the inlet tube to the distribution recess; and
one or more outlet connection tubes positioned at an outlet end of the modular manifold, fluidly coupling the outlet tube to the distribution recess;
one or more manifold inserts removably positioned within the distribution recess of each modular manifold, wherein each manifold insert comprises:
one or more inlet branch channels fluidly coupled to the one or more angled inlet connection tubes, each inlet branch channel including an impinging slot; and
one or more outlet branch channels fluidly coupled to the one or more inlet branch channels and the one or more outlet connection tubes, each outlet branch channel including a collecting slot; and
one or more heat transfer plates coupled to each modular manifold, each heat transfer plate comprising an impingement surface including an array of fins that extend toward the one or more manifold inserts;
wherein a diameter of a first angled inlet connection tube of a first modular manifold is greater than a diameter of a first angled inlet connection tube of a second modular manifold.

19. The modular jet impingement assembly of claim 18 wherein a diameter of a second angled inlet connection tube of the first modular manifold is greater than a diameter of a second angled inlet connection tube of the second modular manifold.

20. The modular jet impingement assembly of claim 19 wherein a diameter of a third angled inlet connection tube of the first modular manifold is greater than a diameter of a third angled inlet connection tube of the second modular manifold.

* * * * *